United States Patent
Wang et al.

(10) Patent No.: US 12,513,977 B2
(45) Date of Patent: Dec. 30, 2025

(54) SEMICONDUCTOR CELL AND ACTIVE AREA ARRANGEMENT

(71) Applicant: Taiwan Semiconductor Manufacturing Company, Ltd., Hsinchu (TW)

(72) Inventors: Pochun Wang, Hsinchu (TW); Chih-Yu Lai, Hsinchu (TW); Chi-Yu Lu, New Taipei (TW); Shang-Hsuan Chiu, Hsinchu (TW); Hui-Zhong Zhuang, Kaohsiung (TW); Chih-Liang Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 902 days.

(21) Appl. No.: 17/744,160

(22) Filed: May 13, 2022

(65) Prior Publication Data

US 2023/0268339 A1 Aug. 24, 2023

Related U.S. Application Data

(60) Provisional application No. 63/313,469, filed on Feb. 24, 2022.

(51) Int. Cl.
*H10D 84/40* (2025.01)
*H10D 84/01* (2025.01)
*H10D 84/85* (2025.01)
*H10D 84/90* (2025.01)
*H10D 89/00* (2025.01)
*H10D 89/10* (2025.01)

(52) U.S. Cl.
CPC ......... *H10D 84/40* (2025.01); *H10D 84/0167* (2025.01); *H10D 84/85* (2025.01); *H10D 84/907* (2025.01); *H10D 84/974* (2025.01); *H10D 89/10* (2025.01); *H10D 89/213* (2025.01)

(58) Field of Classification Search
CPC ...... H10D 84/40; H10D 89/213; H10D 84/85; H10D 89/10; H10D 84/0167; H10D 84/974; H10D 84/907
See application file for complete search history.

(56) References Cited

U.S. PATENT DOCUMENTS

| | | | |
|---|---|---|---|
| 2023/0335537 A1* | 10/2023 | Saini | H10D 84/85 |
| 2025/0021735 A1* | 1/2025 | Fang | G06F 30/392 |
| 2025/0183157 A1* | 6/2025 | Gao | H10D 84/0149 |

* cited by examiner

*Primary Examiner* — David Vu
*Assistant Examiner* — Brandon C Fox
(74) *Attorney, Agent, or Firm* — Merchant & Gould P.C.

(57) ABSTRACT

An integrated circuit including a first cell and a second cell. The first cell includes a first plurality of active areas that extend in a first direction and a first plurality of gates that extend in a second direction that crosses the first direction, the first cell having first cell edges defined by breaks in the first plurality of gates. The second cell includes a second plurality of active areas that extend in the first direction and a second plurality of gates that extend in the second direction, the second cell having second cell edges defined by breaks in the second plurality of gates. Each of the second plurality of active areas is larger than each of the first plurality of active areas and the first cell is adjacent the second cell such that the first cell edges align with the second cell edges.

20 Claims, 21 Drawing Sheets

608

| INPUT | | | | OUTPUT |
|---|---|---|---|---|
| A1 | A2 | B1 | B2 | ZN |
| 0 | 0 | 0 | 0 | 1 |
| 0 | 0 | 0 | 1 | 1 |
| 0 | 0 | 1 | 0 | 1 |
| 0 | 0 | 1 | 1 | 0 |
| 0 | 1 | 0 | 0 | 1 |
| 0 | 1 | 0 | 1 | 1 |
| 0 | 1 | 1 | 0 | 1 |
| 0 | 1 | 1 | 1 | 0 |
| 1 | 0 | 0 | 0 | 1 |
| 1 | 0 | 0 | 1 | 1 |
| 1 | 0 | 1 | 0 | 1 |
| 1 | 0 | 1 | 1 | 0 |
| 1 | 1 | 0 | 0 | 0 |
| 1 | 1 | 0 | 1 | 0 |
| 1 | 1 | 1 | 0 | 0 |
| 1 | 1 | 1 | 1 | 0 |

FIG. 14

SEMICONDUCTOR CELL AND ACTIVE AREA ARRANGEMENT

CROSS-REFERENCE TO RELATED APPLICATIONS

This application claims the benefit of U.S. Provisional Application No. 63/313,469, filed Feb. 24, 2022, and titled "AN OD ARRANGEMENT THAT IMPROVES GATE DENSITY," the disclosure of which is hereby incorporated herein by reference.

BACKGROUND

Traditional standard cell structures include logic gates and functions that have a standard or regular layout structure. The logic gates and functions can also be implemented in other cell structures, such as PPNN cell structures that have larger oxide diffusion (OD) areas or active areas than the traditional standard cell structures. Some PPNN cell structures include OD areas that are twice as large as the OD areas in the traditional standard cell structures. These larger OD areas improve performance, such as clocking rates, of the logic gates and functions in the PPNN cell structures as compared to the logic gates and functions in the traditional standard cell structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the disclosure and are not intended to be limiting.

FIG. 14 is a diagram schematically illustrating a truth table for the AOI function, in accordance with some embodiments.

DETAILED DESCRIPTION

Figure 1:
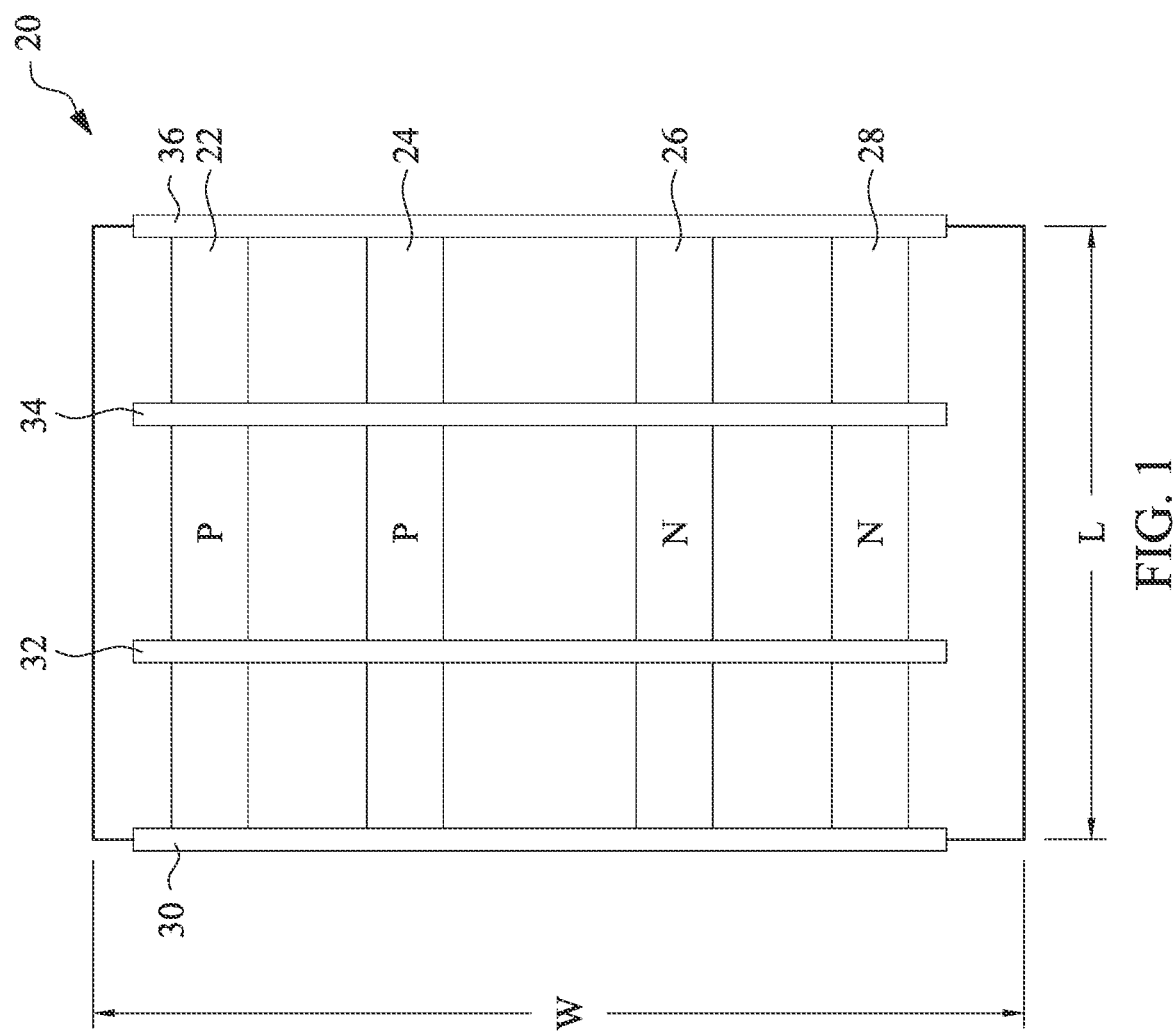
FIG. 1 is a diagram schematically illustrating a split PP/NN cell structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Both, the traditional standard cell structures and the PPNN cell structures can include logic gates and functions. However, the size of a PPNN cell structure is different than the size of a traditional standard cell structure, such that the PPNN cell structure cannot directly abut the traditional standard cell structure. Instead, a buffer area is situated between the PPNN cell structure and the traditional standard cell structure, which results in a loss of circuit area and a reduction in the logic density of an integrated circuit (IC). Also, the cell edge of a cell structure can be roughly defined by the gate positions of the cell, where the gates are broken off or cut at the cell edges. For a traditional standard cell structure, the gates are broken off between P-P areas or between N-N areas, but for a PPNN cell structure, the gates are broken off or cut between a P-N boundary. As a result, the PPNN cell structure cannot directly abut the traditional standard cell structure without at least some of the gates shorting together.

Disclosed embodiments include a split PP/NN cell structure that is directed to increasing the logic density of an IC. Embodiments of the disclosure include a split PP/NN cell structure that has a cell size that is the same as the cell size of a PPNN cell structure, and that includes more logic gates and/or functions in one cell of the split PP/NN cell structure than in one cell of the PPNN cell structure, which increases the logic density of the IC. Also, for the split PP/NN cell structure, the gates are broken off between a P-N boundary, just as in the PPNN cell structure. Thus, the split PP/NN cell structure can directly abut a PPNN cell structure. without gates shorting together and without a buffer area situated between the split PP/NN cell structure and the PPNN cell structure, which increases the logic density of the IC.

Embodiments of the disclosure further include split PP/NN structures that include one or more "fly metal-over-diffusion (MD)" contacts that are electrically insulated, by an insulation layer, from the OD areas situated below the MDs. This enables providing more logic gates and functions in one cell. For example, in some embodiments, the fly MD can be electrically connected with a $1^{st}$ and a $4^{th}$ OD area, and isolated or insulated from a $2^{nd}$ and a $3^{rd}$ OD area. Also, the subject matter of this disclosure can be used in different technologies, such as planar field-effect transistor (FET) technologies, FinFET technologies, and nano sheet technologies.

Also, disclosed embodiments include a split PP/NN cell structure that has the same area as a PPNN cell structure and that can include more logic gates and functions than the PPNN cell structure. This increases the logic density of an IC. Also, the split PP/NN cell structure can directly abut the PPNN cell structure without an intervening buffer area, which also increases the logic density of the IC. In some embodiments, the split PP/NN cell structure includes two inverters and the PPNN cell structure includes one inverter. In some embodiments, the split PP/NN cell structure includes two 2-input Nand gates and the PPNN cell structure includes one 2-input Nand gate. In some embodiments, the split PP/NN cell structure has a cell area that is 20% more than the cell area of the PPNN cell structure. In some embodiments, the split PP/NN cell structure includes two AOI (And-Or-Invert) circuits and the PPNN cell structure includes only one AOI circuit. In some embodiments, the split PP/NN cell structure includes two or more different logic gates or functions, such as 2-input Nand gates and 2-input Nor gates, which increases the logic density of the IC and design flexibility.

FIG. 1 is a diagram schematically illustrating a split PP/NN cell structure 20, in accordance with some embodiments. The split PP/NN cell structure 20 includes four OD areas or active areas 22, 24, 26, and 28 extending in a first direction and four gate contacts 30, 32, 34, and 36 extending in a second direction that intersects the first direction. The four OD areas include two p-type OD areas 22 and 24 and two n-type OD areas 26 and 28. In some embodiments, the first direction is perpendicular to the second direction. In some embodiments, the gate contacts 30, 32, 34, and 36 include polycrystalline silicon, also referred to as polysilicon or poly. In some embodiments, the split PP/NN cell structure 20 includes more or less than the four OD areas 22, 24, 26, and 28. In some embodiments, the split PP/NN cell structure 20 includes more or less than the four gate contacts 30, 32, 34, and 36.

The split PP/NN cell structure 20 is directed to increasing the logic density of an IC. The split PP/NN cell structure 20 has a cell size with a length L and a width W. In some embodiments, the split PP/NN structure 20 includes one or more fly MD contacts (not shown in FIG. 1) extending in the second direction. The fly MD contacts are electrically insulated from one or more of the OD areas 22, 24, 26, and 28, which enables providing more logic gates and functions in one cell. For example, in some embodiments, one or more of the fly MD contacts can be electrically connected to OD areas 22 and 28, and isolated or insulated from OD areas 24 and 26. Also, the split PP/NN cell structure 20 can be used in different technologies, such as planar FET, FinFET, and nano sheet technologies.

Figure 2:
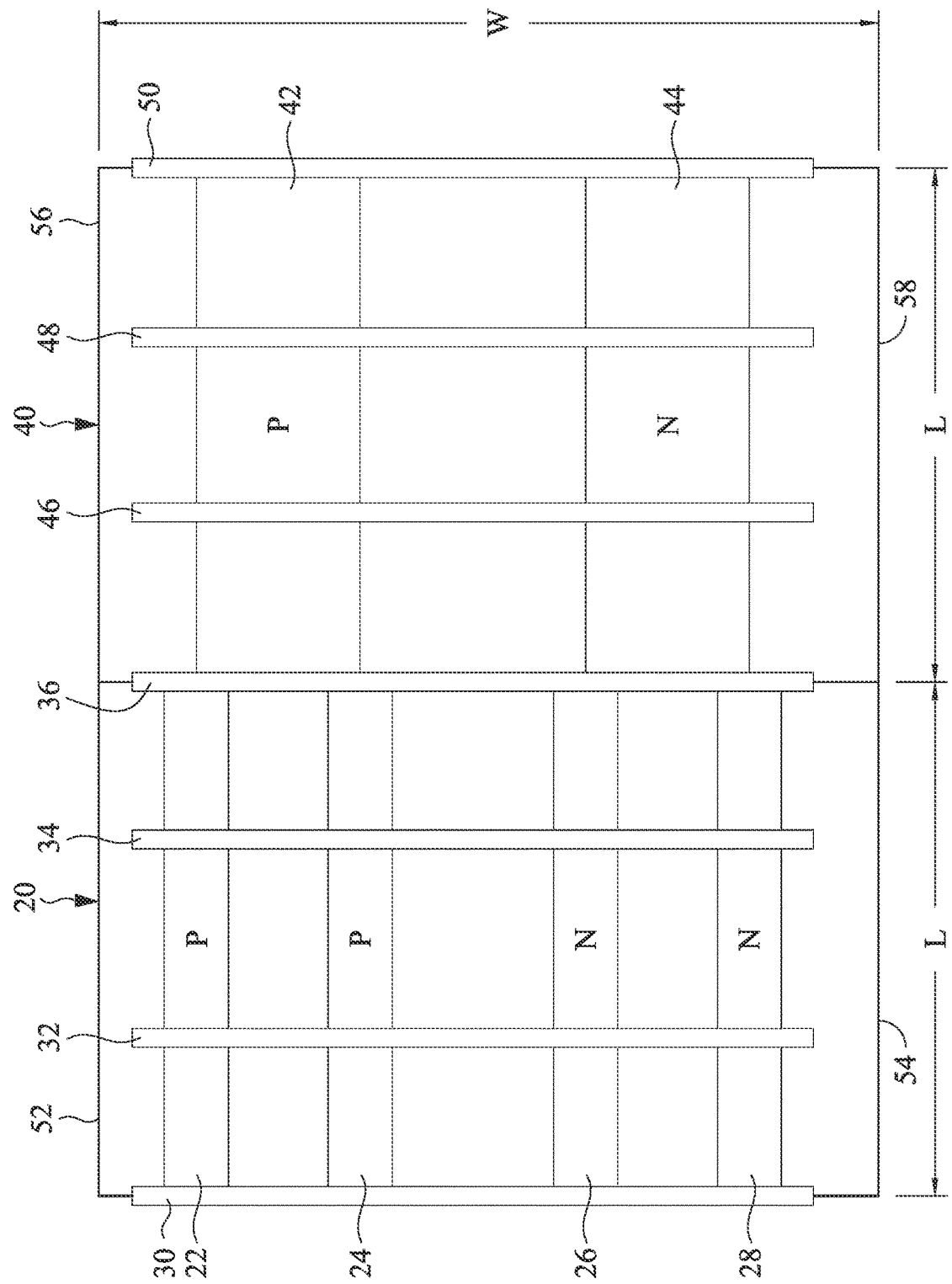
FIG. 2 is a diagram schematically illustrating the split PP/NN cell structure situated adjacent a PPNN cell structure, in accordance with some embodiments.

FIG. 2 is a diagram schematically illustrating the split PP/NN cell structure 20 situated adjacent a PPNN cell structure 40, in accordance with some embodiments. The split PP/NN cell structure 20 includes the four OD areas 22, 24, 26, and 28 extending in the first direction and the four gate contacts 30, 32, 34, and 36 extending in the second direction. The PPNN cell structure 40 includes two OD areas 42 and 44, including one p-type OD area 42 and one n-type OD area 44, extending in the first direction and four gate contacts 36, 46, 48, and 50 extending in the second direction. Each of the two OD areas 42 and 44 is larger than each of the four OD areas 22, 24, 26, and 28. The four gate contacts 36, 46, 48, and 50 include one gate contact 36 that is shared with the split PP/NN cell structure 20. In some embodiments, the contact 36 is a dummy gate contact. In some embodiments, the first direction is perpendicular to the second direction. In some embodiments, the gate contacts 30, 32, 34, 36, 46, 48, and 50 include poly.

In this example, the split PP/NN cell structure 20 has a cell size, including length L and width W, that is the same as the cell size, including length L and width W, of the PPNN cell structure 40. In some embodiments, the split PP/NN cell structure 20 can and does include more logic gates and/or functions than the PPNN cell structure 40, which increases the logic density of an IC.

In the split PP/NN cell structure 20, the gate contacts 30, 32, 34, and 36 are broken off or cut between a P boundary of one cell and an N boundary of another adjoining cell. These breaks or cuts in the gate contacts 30, 32, 34, and 36 define the cell edges 52 and 54 in the split PP/NN cell structure 20. Also, in the PPNN cell structure 40, the gate contacts 36, 46, 48, and 50 are broken off or cut between a P boundary of one cell and an N boundary of another adjoining cell. These breaks or cuts in the gate contacts 36, 46, 48, and 50 define the cell edges 56 and 58 in the PPNN cell structure 40. Thus, the split PP/NN cell structure 20 directly abuts the PPNN cell structure 40 without gate contacts shorting together and without a buffer area situated between the split PP/NN cell structure 20 and the PPNN cell structure 40, which increases the logic density of the IC. Also, the split PP/NN cell structure 20 is adjacent the PPNN cell structure 40 such that the cell edges 52 and 54 align with the cell edges 56 and 58, respectively, i.e., the cell edge 52 is at the same vertical position as the cell edge 56, and the cell edge 54 is at the same vertical position as the cell edge 58.

In some embodiments, the split PP/NN cell structure 20 includes two inverters and the PPNN cell structure 40 includes one inverter. In some embodiments, the split PP/NN cell structure 20 includes two 2-input Nand gates and the PPNN cell structure 40 includes one 2-input Nand gate. In some embodiments, the split PP/NN cell structure 20 includes two AOI22 circuits and the PPNN cell structure 40 includes only one AOI22 circuit. In some embodiments, the split PP/NN cell structure 20 has a cell area that is 20% more than the cell area of the PPNN cell structure 40. In some embodiments, the split PP/NN cell structure 20 includes two or more different logic gates or functions, such as 2-input Nand gates and 2-input Nor gates, which increases the logic density of the IC and design flexibility.

Figure 3:
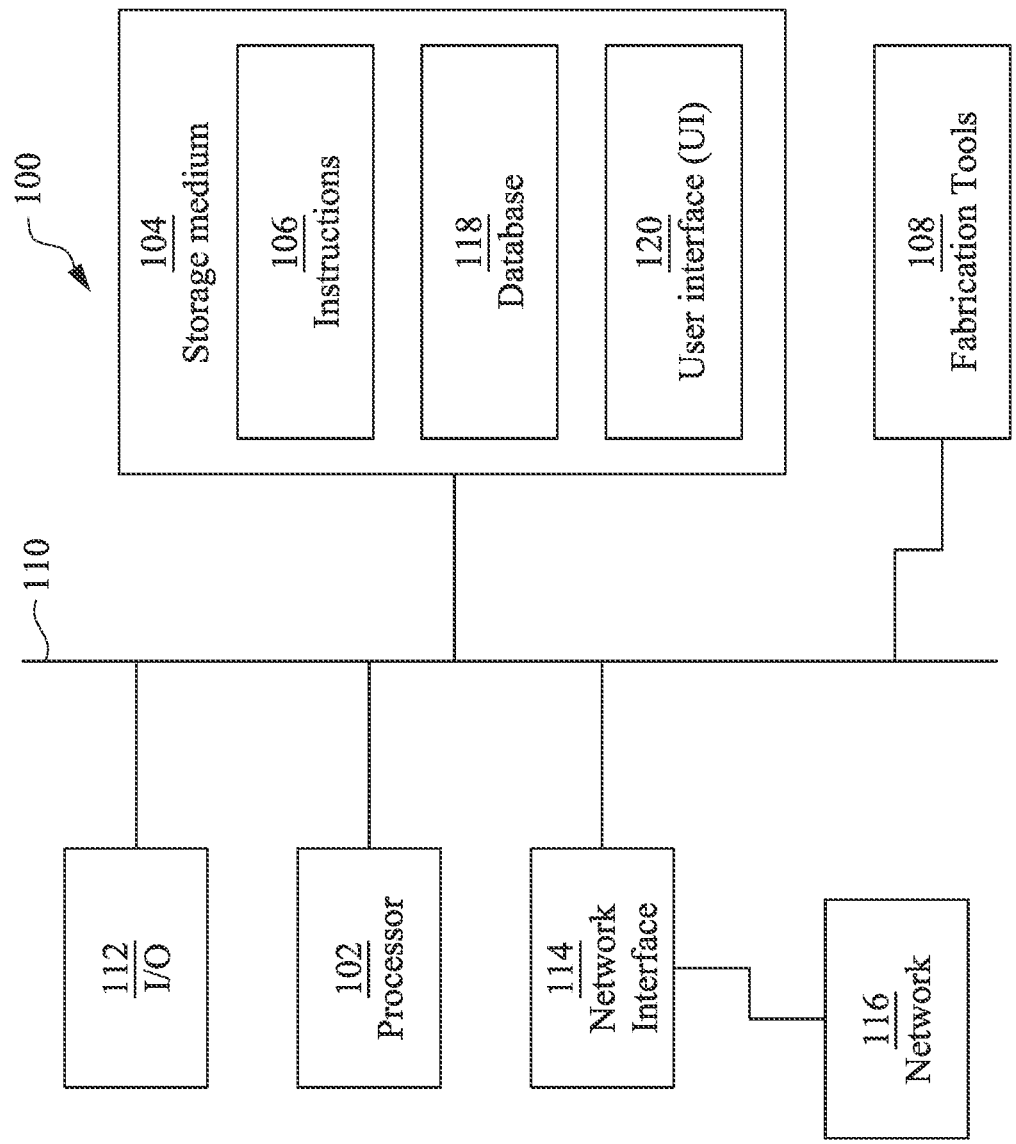
FIG. 3 is a block diagram schematically illustrating an example of a computer system configured to provide an IC that includes the split PP/NN cell structure and/or the PPNN cell structure, in accordance with some embodiments.

FIG. 3 is a block diagram schematically illustrating an example of a computer system 100 configured to provide an IC device that includes the split PP/NN cell structure 20 and/or the PPNN cell structure 40, in accordance with some embodiments. Some or all the design and manufacture of ICs including the split PP/NN cell structure 20 and the PPNN cell structure 40 can be performed by or with the computer system 100. In some embodiments, the computer system 100 includes an EDA system.

In some embodiments, the system 100 is a general-purpose computing device including a processor 102 and a non-transitory, computer-readable storage medium 104. The computer-readable storage medium 104 may be encoded with, e.g., store, computer program code such as executable instructions 106. Execution of the instructions 106 by the processor 102 provides (at least in part) a design tool that implements a portion or all the functions of the system 100, such as pre-layout simulations, post-layout simulations, rerouting of the IC, and a final layout for manufacturing. Further, fabrication tools 108 are included to further layout and physically implement the design and manufacture of the ICs. In some embodiments, the system 100 includes a commercial router. In some embodiments, the system 100 includes an APR system.

The processor 102 is electrically coupled to the computer-readable storage medium 104 by a bus 110 and to an I/O interface 112 by the bus 110. A network interface 114 is also electrically connected to the processor 102 by the bus 110. The network interface 114 is connected to a network 116, so that the processor 102 and the computer-readable storage medium 104 can connect to external elements using the network 116. The processor 102 is configured to execute the computer program code or instructions 106 encoded in the computer-readable storage medium 104 to cause the system 100 to perform a portion or all the functions of the system 100. In some embodiments, the processor 102 is a central processing unit (CPU), a multi-processor, a distributed processing system, an application specific integrated circuit (ASIC), and/or a suitable processing unit.

In some embodiments, the computer-readable storage medium 104 is an electronic, magnetic, optical, electromagnetic, infrared, and/or semiconductor system or apparatus or device. For example, the computer-readable storage medium 104 can include a semiconductor or solid-state memory, a magnetic tape, a removable computer diskette, a random-access memory (RAM), a read-only memory (ROM), a rigid magnetic disk, and/or an optical disk. In some embodiments using optical disks, the computer-readable storage medium 104 can include a compact disk, read only memory (CD-ROM), a compact disk read/write memory (CD-R/W), and/or a digital video disc (DVD).

In some embodiments, the computer-readable storage medium 104 stores computer program code or instructions 106 configured to cause the system 100 to perform a portion or all the functions of the system 100. In some embodiments, the computer-readable storage medium 104 also stores information which facilitates performing a portion or all the functions of the system 100. In some embodiments, the computer-readable storage medium 104 stores a database 118 that includes one or more of component libraries, digital circuit cell libraries, and databases.

The EDA system 100 includes the I/O interface 112, which is coupled to external circuitry. In some embodiments, the I/O interface 112 includes a keyboard, keypad, mouse, trackball, trackpad, touchscreen, and/or cursor direction keys for communicating information and commands to the processor 102.

The network interface 114 is coupled to the processor 102 and allows the system 100 to communicate with the network 116, to which one or more other computer systems are connected. The network interface 114 can include: wireless network interfaces such as BLUETOOTH, WIFI, WIMAX, GPRS, or WCDMA; or wired network interfaces such as ETHERNET, USB, or IEEE-1364. In some embodiments, a portion or all the functions of the system 100 can be performed in two or more systems that are like system 100.

The system 100 is configured to receive information through the I/O interface 112. The information received through the I/O interface 112 includes one or more of instructions, data, design rules, libraries of components and cells, and/or other parameters for processing by processor 102. The information is transferred to the processor 102 by the bus 110. Also, the system 100 is configured to receive information related to a user interface (UI) through the I/O interface 112. This UI information can be stored in the computer-readable storage medium 104 as a UI 120.

In some embodiments, a portion or all the functions of the system 100 are implemented via a standalone software application for execution by a processor. In some embodiments, a portion or all the functions of the system 100 are implemented in a software application that is a part of an additional software application. In some embodiments, a portion or all the functions of the system 100 are implemented as a plug-in to a software application. In some embodiments, at least one of the functions of the system 100 is implemented as a software application that is a portion of an EDA tool. In some embodiments, a portion or all the functions of the system 100 are implemented as a software application that is used by the system 100. In some embodiments, a layout diagram is generated using a tool such as VIRTUOSO available from CADENCE DESIGN SYSTEMS, Inc., or another suitable layout generating tool.

In some embodiments, the IC device layouts and other processes are realized as functions of a program stored in a non-transitory computer readable recording medium. Examples of a non-transitory computer readable recording medium include, but are not limited to, external/removable and/or internal/built-in storage or memory units, e.g., one or more optical disks such as a DVD, a magnetic disk such as a hard disk, a semiconductor memory such as a ROM and RAM, and a memory card, and the like.

As noted above, embodiments of the system 100 include fabrication tools 108 for implementing the manufacturing processes of the system 100. For example, based on the final layout, photolithographic masks may be generated, which are used to fabricate the IC by the fabrication tools 108.

Figure 4:
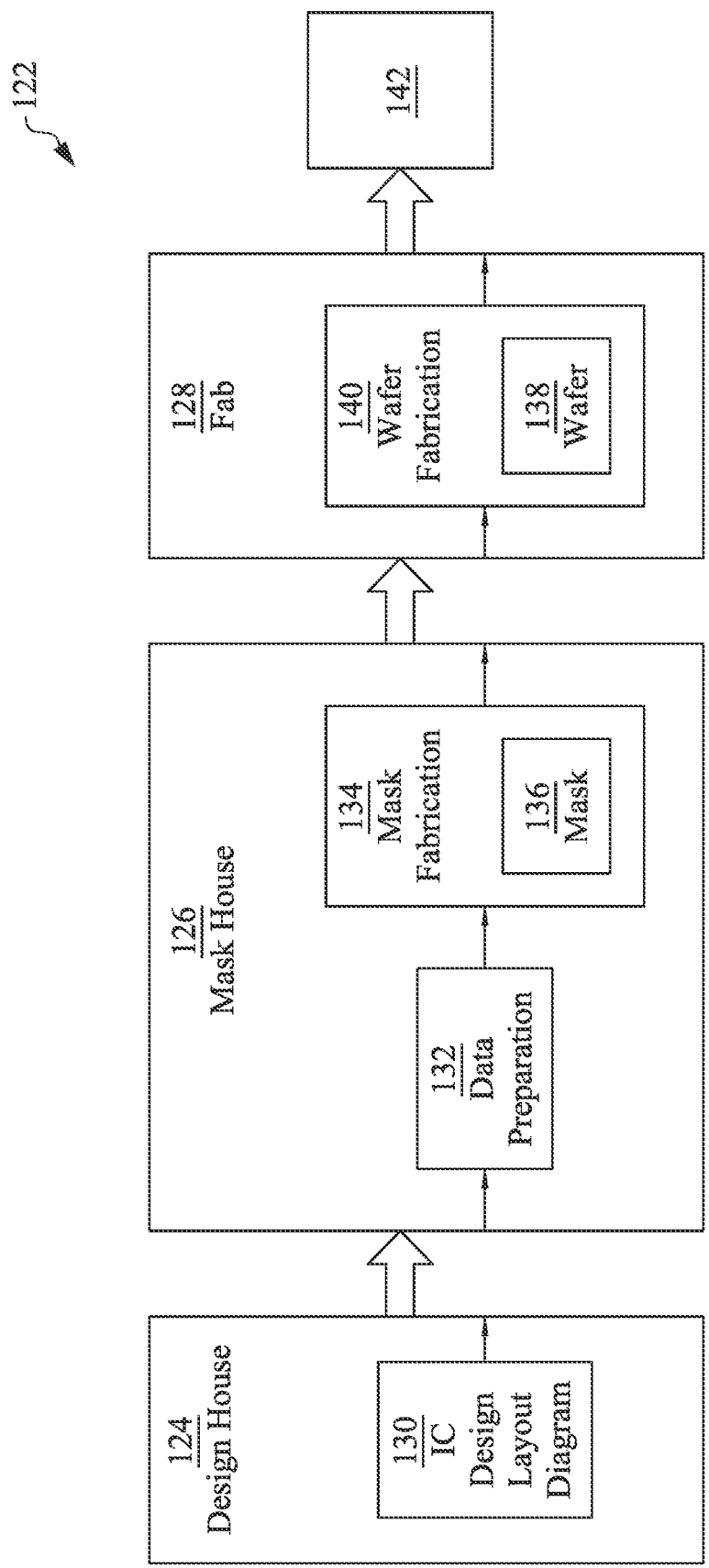
FIG. 4 is a block diagram schematically illustrating an IC manufacturing system and an IC manufacturing flow associated therewith, in accordance with some embodiments.

Further aspects of device fabrication are disclosed in conjunction with FIG. 4, which is a block diagram of an IC manufacturing system 122 and an IC manufacturing flow associated therewith, in accordance with some embodiments. In some embodiments, based on a layout diagram, one or more semiconductor masks and/or at least one component in a layer of a semiconductor IC is fabricated using the manufacturing system 122.

In FIG. 4, the IC manufacturing system 122 includes entities, such as a design house 124, a mask house 126, and an IC manufacturer/fabricator ("fab") 128, that interact with one another in the design, development, and manufacturing cycles and/or services related to manufacturing an IC, such as the ICs described herein. The entities in the system 122 are connected by a communications network. In some embodiments, the communications network is a single network. In some embodiments, the communications network is a variety of different networks, such as an intranet and the internet. The communications network includes wired and/or wireless communication channels. Each entity interacts with one or more of the other entities and provides services to and/or receives services from one or more of the other entities. In some embodiments, two or more of the design house 124, the mask house 126, and the IC fab 128 are owned by a single larger company. In some embodiments, two or more of the design house 124, the mask house 126, and the IC fab 128 coexist in a common facility and use common resources.

The design house (or design team) 124 generates an IC design layout diagram 130. The IC design layout diagram 130 includes various geometrical patterns, or IC layout diagrams designed for an IC device. The geometrical patterns correspond to patterns of metal, oxide, or semiconductor layers that make up the various components of the semiconductor structures to be fabricated. The various layers combine to form various IC features. For example, a portion of the IC design layout diagram 130 includes various IC features, such as diagonal vias, active areas or regions, gate electrodes, sources, drains, metal lines, local vias, and openings for bond pads, to be formed in a semiconductor substrate (such as a silicon wafer) and in various material layers disposed on the semiconductor substrate. The design house 124 implements a design procedure to form an IC design layout diagram 130. The IC design layout diagram 130 is presented in one or more data files having information of the geometrical patterns. For example, IC design layout diagram 130 can be expressed in a GDSII file format or DFII file format. In some embodiments, the design procedure includes one or more of analog circuit design, digital logic circuit design, the split PP/NN cell structure 20, the PPNN cell structure 40, place and route routines, and physical layout designs.

The mask house 126 includes data preparation 132 and mask fabrication 134. The mask house 126 uses the IC design layout diagram 130 to manufacture one or more masks 136 to be used for fabricating the various layers of the IC or semiconductor structure. The mask house 126 performs mask data preparation 132, where the IC design layout diagram 130 is translated into a representative data file (RDF). The mask data preparation 132 provides the RDF to the mask fabrication 134. The mask fabrication 134 includes a mask writer that converts the RDF to an image on a substrate, such as a mask (reticle) 136 or a semiconductor wafer 138. The design layout diagram 130 is manipulated by the mask data preparation 132 to comply with characteristics of the mask writer and/or criteria of the IC fab 128. In FIG. 4, the mask data preparation 132 and the mask fabrication 134 are illustrated as separate elements. In some embodiments, the mask data preparation 132 and the mask fabrication 134 can be collectively referred to as mask data preparation.

In some embodiments, the mask data preparation 132 includes an optical proximity correction (OPC) which uses lithography enhancement techniques to compensate for image errors, such as those that can arise from diffraction, interference, other process effects and the like. The OPC adjusts the IC design layout diagram 130. In some embodiments, the mask data preparation 132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 132 includes a mask rule checker (MRC) that checks the IC design layout diagram 130 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 130 to compensate for limitations during the mask fabrication 134, which may undo part of the modifications performed by OPC to meet mask creation rules.

In some embodiments, the mask data preparation 132 includes lithography process checking (LPC) that simulates processing that will be implemented by the IC fab 128. LPC simulates this processing based on the IC design layout diagram 130 to create a simulated manufactured device. The processing parameters in LPC simulation can include parameters associated with various processes of the IC manufacturing cycle, parameters associated with tools used for manufacturing the IC, and/or other aspects of the manufacturing process. LPC considers various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine the IC design layout diagram 130.

The above description of mask data preparation 132 has been simplified for the purposes of clarity. In some embodiments, data preparation 132 includes additional features such as a logic operation (LOP) to modify the IC design layout diagram 130 according to manufacturing rules. Additionally, the processes applied to the IC design layout diagram 130 during data preparation 132 may be executed in a variety of different orders.

After the mask data preparation 132 and during the mask fabrication 134, a mask 136 or a group of masks 136 are fabricated based on the modified IC design layout diagram 130. In some embodiments, the mask fabrication 134 includes performing one or more lithographic exposures based on the IC design layout diagram 130. In some embodiments, an electron-beam (e-beam) or a mechanism of multiple e-beams is used to form a pattern on a mask (photomask or reticle) 136 based on the modified IC design layout diagram 130. The mask 136 can be formed in various technologies. In some embodiments, the mask 136 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region, and transmits through the transparent regions. In one example, a binary mask version of the mask 136 includes a transparent substrate (e.g., fused quartz) and an opaque material (e.g., chromium) coated in the opaque regions of the binary mask. In another example, the mask 136 is formed using a phase shift technology. In a phase shift mask (PSM) version of the mask 136, various features in the pattern formed on the phase shift mask are configured to have proper phase difference to enhance the resolution and imaging quality. In various examples, the phase shift mask can be attenuated PSM or alternating PSM. The mask(s) generated by the mask fabrication 134 is used in a variety of processes. For example, such a mask(s) is used in an ion implantation process to form various doped regions in the semiconductor wafer 138, in an etching process to form various etching regions in the semiconductor wafer 138, and/or in other suitable processes.

The IC fab 128 includes wafer fabrication 140. The IC fab 128 is an IC fabrication business that includes one or more manufacturing facilities for the fabrication of a variety of different IC products. In some embodiments, the IC fab 128 is a semiconductor foundry. For example, there may be a manufacturing facility for the front end of line (FEOL) fabrication of a plurality of IC products, while a second manufacturing facility may provide the back end of line (BEOL) fabrication for the interconnection and packaging of the IC products, and a third manufacturing facility may provide other services for the foundry business.

The IC fab 128 uses the mask(s) 136 fabricated by the mask house 126 to fabricate the semiconductor structures or ICs 142 of the current disclosure. Thus, the IC fab 128 at least indirectly uses the IC design layout diagram 130 to fabricate the semiconductor structures or ICs 142 of the current disclosure. Also, the semiconductor wafer 138 includes a silicon substrate or other proper substrate having material layers formed thereon, and the semiconductor wafer 138 further includes one or more of various doped regions, dielectric features, multilevel interconnects, and the like (formed at subsequent manufacturing steps). In some embodiments, the semiconductor wafer 138 is fabricated by the IC fab 128 using the mask(s) 136 to form the semiconductor structures or ICs 142 of the current disclosure. In some embodiments, the IC fabrication includes performing one or more lithographic exposures based at least indirectly on the IC design layout diagram 130.

As described above, in some embodiments, the split PP/NN cell structure 20 includes one or more fly MD contacts that are electrically insulated from one or more of the OD areas 22, 24, 26, and 28, which enables providing more logic gates and functions in one cell. The split PP/NN cell structure 20 and/or the PPNN cell structure 40 are further described below with reference to the figures.

Figure 5:
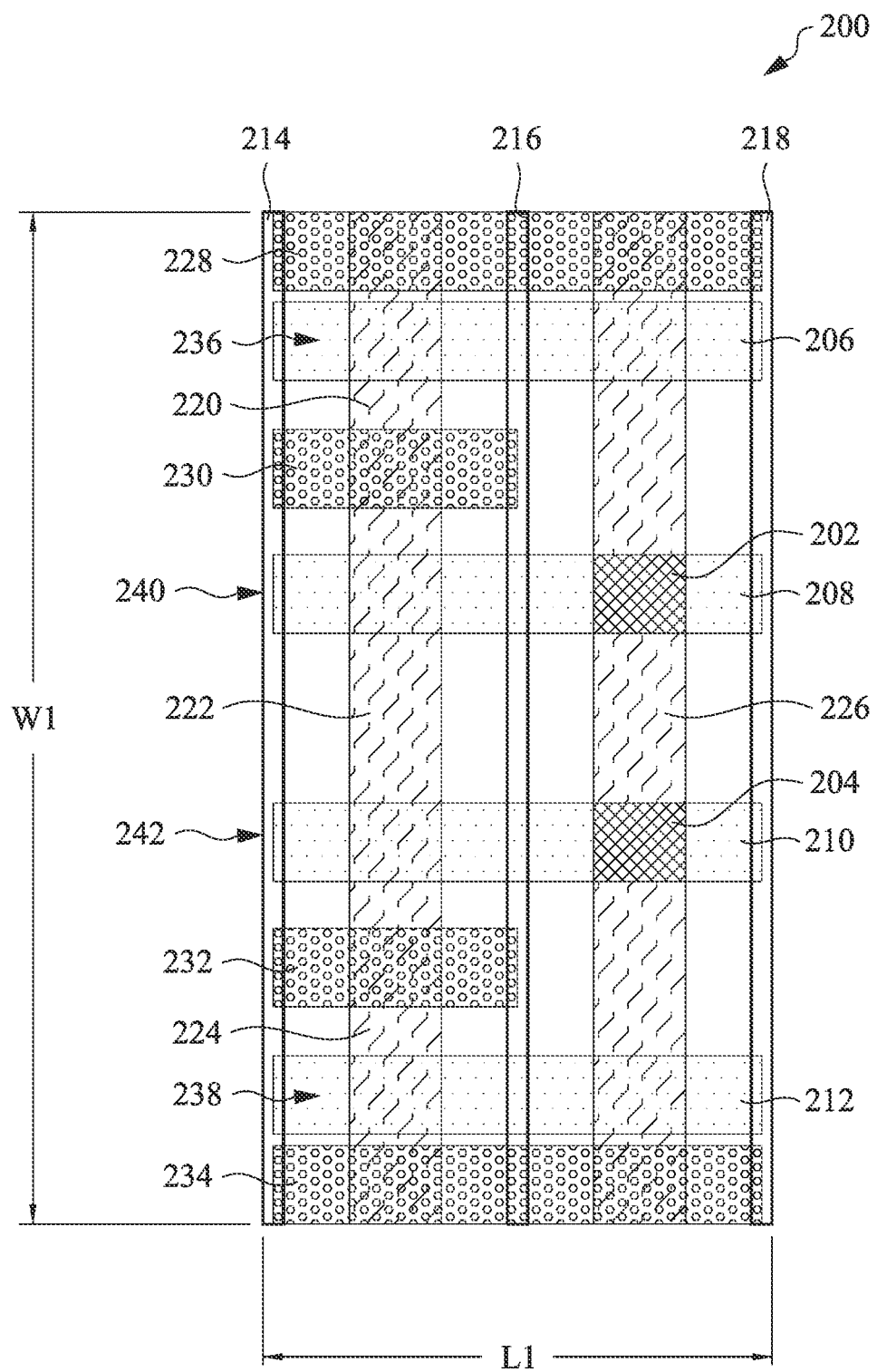
FIG. 5 is a diagram schematically illustrating the split PP/NN cell structure and two isolation areas, in accordance with some embodiments.
Figure 6:
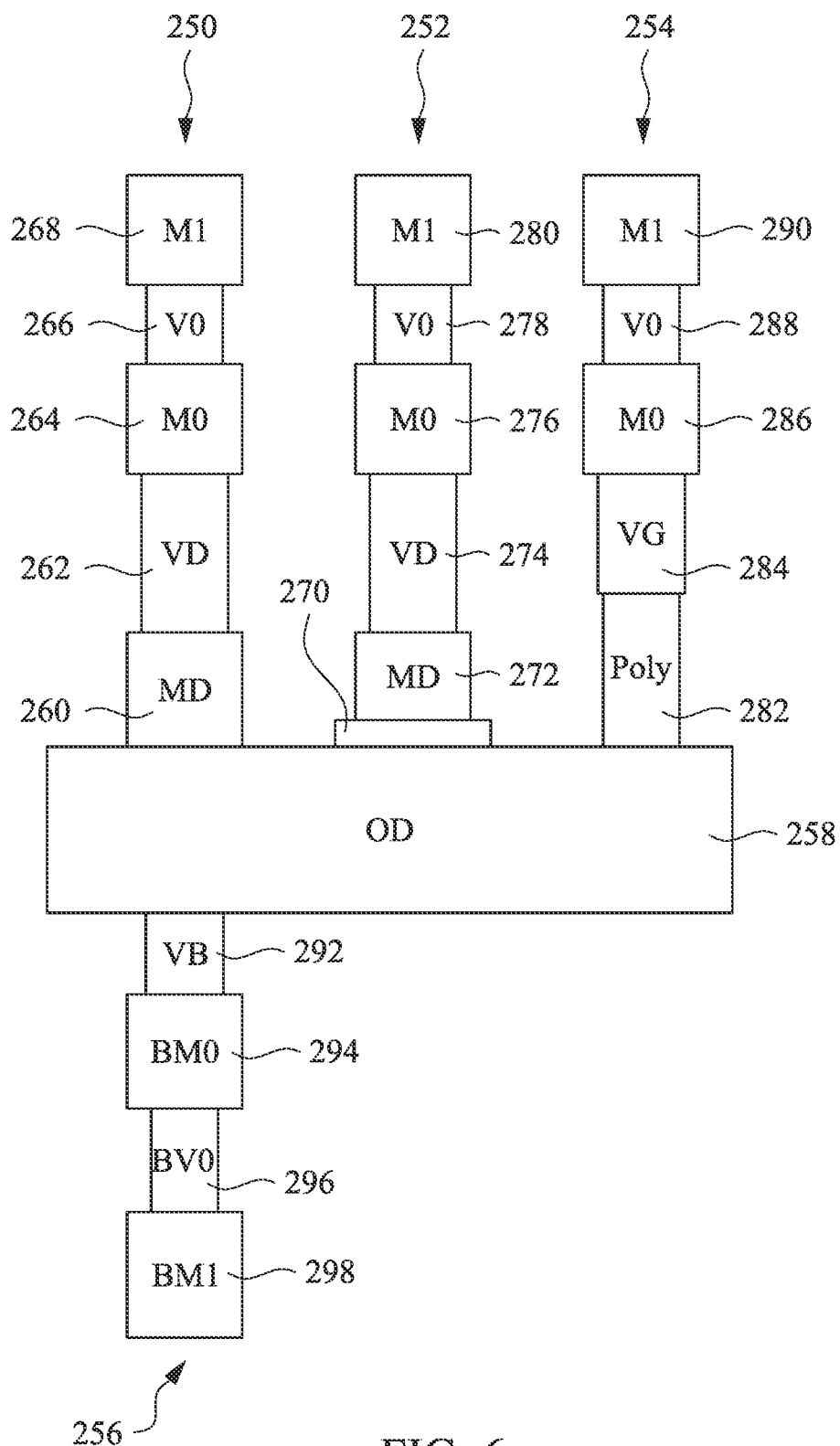
FIG. 6 is a diagram schematically illustrating different connections to an OD area, in accordance with some embodiments.

FIGS. 5 and 6 are diagrams schematically illustrating a split PP/NN cell structure 200 that includes two isolation areas 202 and 204, and different connections to the split PP/NN cell structure 200, in accordance with some embodiments. The split PP/NN cell structure 200 has a length L1 and a width W1 and is directed to increasing the logic density of an IC. In some embodiments, the split PP/NN cell structure 200 is like the split PP/NN cell structure 20 of FIG. 1.

FIG. 5 is a diagram schematically illustrating the split PP/NN cell structure 200 and the two isolation areas 202 and 204, in accordance with some embodiments. The split PP/NN cell structure 200 includes four OD areas 206, 208, 210, and 212 extending in a first direction and three gate contacts 214, 216, and 218 extending in a second direction that intersects the first direction. In some embodiments, the first direction is perpendicular to the second direction. In some embodiments, the gate contacts 214, 216, and 218 include polycrystalline silicon, also referred to as polysilicon or poly. In some embodiments, the four OD areas 206, 208, 210, and 212 include two p-type OD areas 206 and 208 and two n-type OD areas 210 and 212. In some embodiments, the split PP/NN cell structure 200 includes more or less than the four OD areas 206, 208, 210, and 212. In some embodiments, the split PP/NN cell structure 200 includes more or less than the three gate contacts 214, 216, and 218.

The split PP/NN structure 200 includes MD contacts 220, 222, 224 and 226 extending in the second direction. The split PP/NN structure 200 also includes cut MD (CMD) areas 228, 230, 232, and 234. The CMD area 230 is situated between the MD contacts 220 and 222 to separate the MD contacts 220 and 222 from each other, and the CMD area 232 is situated between the MD contacts 222 and 224 to separate the MD contacts 222 and 224 from one another. The CMD areas 228 and 234 are situated at opposing ends of the split PP/NN structure 200 to cut off the MD contacts 220 and 226 at one end and to cut off the MD contacts 224 and 226 at the other end.

The MD contacts 220, 222, 224 and 226 are electrically connected to one or more of the OD areas 206, 208, 210, and 212. The MD contact 220 is electrically connected to the OD area 206, and the MD contact 224 is electrically connected to the OD area 212. The MD contact 222 is electrically connected to each of the OD areas 208 and 210, which electrically connects the OD areas 208 and 210 together. The MD contact 226 is electrically connected to each of the OD areas 206 and 212, which electrically connects the OD areas 206 and 212 together.

The MD contact 226 is electrically insulated from the OD area 208 by an insulator situated between the MD contact 226 and the OD area 208 in the isolation area 202, and the MD contact 226 is electrically insulated from the OD area 210 by an insulator situated between the MD contact 226 and the OD area 210 in the isolation area 204. In the isolation areas 202 and 204, the MD contact 226 is referred to as a fly MD contact, which enables providing more logic gates and functions in the split PP/NN cell structure 200.

For example, in the split PP/NN cell structure 200, a first set of transistors includes a first transistor 236 that includes the OD area 206 electrically connected to the OD area 212 of a second transistor 238. Also, a second set of transistors includes a third transistor 240 that includes the OD area 208 electrically connected to the OD area 210 of a fourth transistor 242. The gates of the transistors 236, 238, 240 and 242 can be separated from one another and electrically coupled such that the first set of transistors 236 and 238 and the second set of transistors 240 and 242 are used to provide different circuits. In some embodiments, the split PP/NN cell structure 200 can be used in a planar FET device. In some embodiments, the split PP/NN cell structure 200 can be used in a finFET device. In some embodiments, the split PP/NN cell structure 200 can be used in a nano sheet device.

FIG. 6 is a diagram schematically illustrating different connections 250, 252, 254, and 256 to an OD area 258, in accordance with some embodiments. The different connections 250, 252, 254, and 256 include a drain/source connection 250, a fly MD connection 252, a gate connection 254, and a power/reference connection 256. In some embodiments, the OD area 258 is one of the OD areas 206, 208, 210, and 212 of the split PP/NN cell structure 200.

The drain/source connection 250 includes an MD contact 260 electrically connected to the OD area 258 and to a via over diffusion VD 262. First layer metal M0 264 is electrically connected to the VD 262 and to a metal interconnect via V0 266 that is electrically connected to second layer metal M1 268. The drain/source connection 250 is used to connect to the drain and/or the source of a transistor.

The fly MD connection 252 includes an insulator 270 situated on the OD area 258 and configured to insulate an MD contact 272 from the OD area 258. The MD contact 272 is electrically connected to a different OD area and to a VD 274. First layer metal M0 276 is electrically connected to the VD 274 and to a metal interconnect via V0 278 that is electrically connected to second layer metal M1 280. The fly MD connection 252 insulates the MD contact 272 from the OD area 258.

The gate connection 254 includes a poly contact 282 electrically connected to the OD area 258 and to a via over gate VG 284. First layer metal M0 286 is electrically connected to the VG 284 and to a metal interconnect via V0 288 that is electrically connected to second layer metal M1 290. The gate connection 254 is used to connect to the gate of the transistor.

The power/reference connection 256 includes a via VB 292 electrically connected to the OD area 258 and to a power/reference first layer metal BM0 294 that is electrically connected to a metal interconnect layer BV0 296 that is electrically connected to a power/reference second layer metal BM1 298. The power/reference connection 256 is used to connect the OD area 258 to power or a reference, such as ground.

In some embodiments, the different connections 250, 252, 254, and 256, including the drain/source connection 250, the fly MD connection 252, the gate connection 254, and the power/reference connection 256, are used in the split PP/NN cell structure 200 of FIG. 5. In some embodiments, the different connections 250, 252, 254, and 256, including the drain/source connection 250, the fly MD connection 252, the gate connection 254, and the power/reference connection 256, are used in another split PP/NN cell structure. Also, in some embodiments, the first and second sets of transistors in the split PP/NN cell structure 200 are used to provide different circuits, such as two inverters in the split PP/NN cell structure 200.

Figure 7:
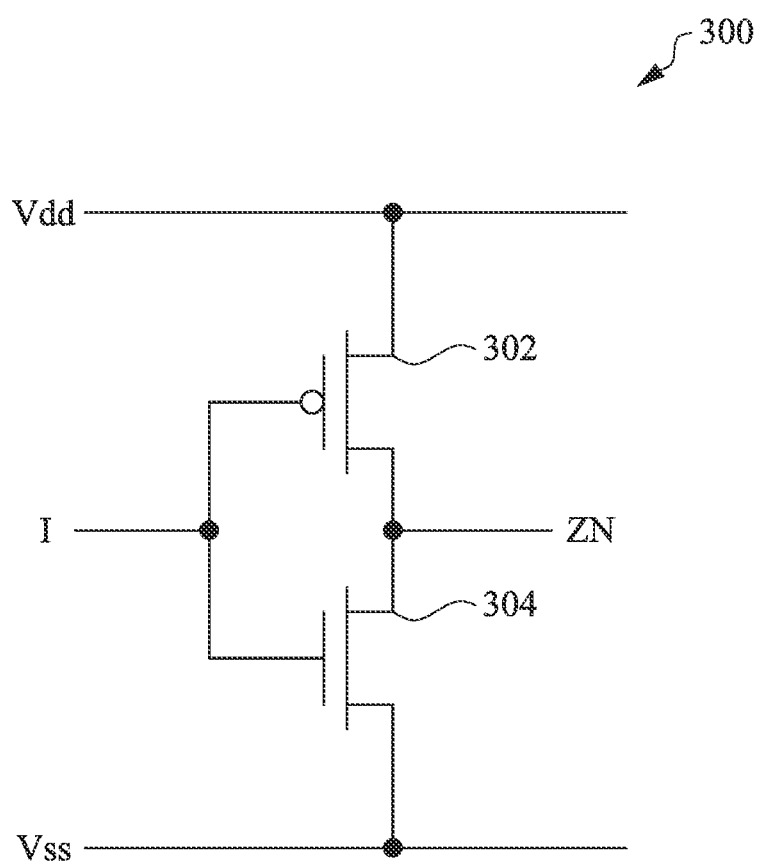
FIG. 7 is a diagram schematically illustrating a complementary metal-oxide semiconductor (cmos) inverter, in accordance with some embodiments.

FIG. 7 is a diagram schematically illustrating a complementary metal-oxide semiconductor (cmos) inverter 300, in accordance with some embodiments. In some embodiments, a split PP/NN cell structure like the split PP/NN cell structure 200 includes two of the inverters 300, and a PPNN cell structure of the same size can include only one inverter 300.

The inverter 300 includes a p-type metal-oxide semiconductor (PMOS) transistor 302 electrically connected in series with an n-type metal-oxide semiconductor (NMOS) transistor 304. One drain/source region of the PMOS transistor 302 is electrically connected to power Vdd and the other drain/source region of the PMOS transistor 302 is electrically connected, at an output ZN of the inverter 300, to one drain/source region of the NMOS transistor 304. The other drain/source region of the NMOS transistor 304 is electrically connected to a reference Vss, such as ground. The gate of the PMOS transistor 302 and the gate of the NMOS transistor 304 are electrically coupled together and to receive an input signal I.

Figure 8:
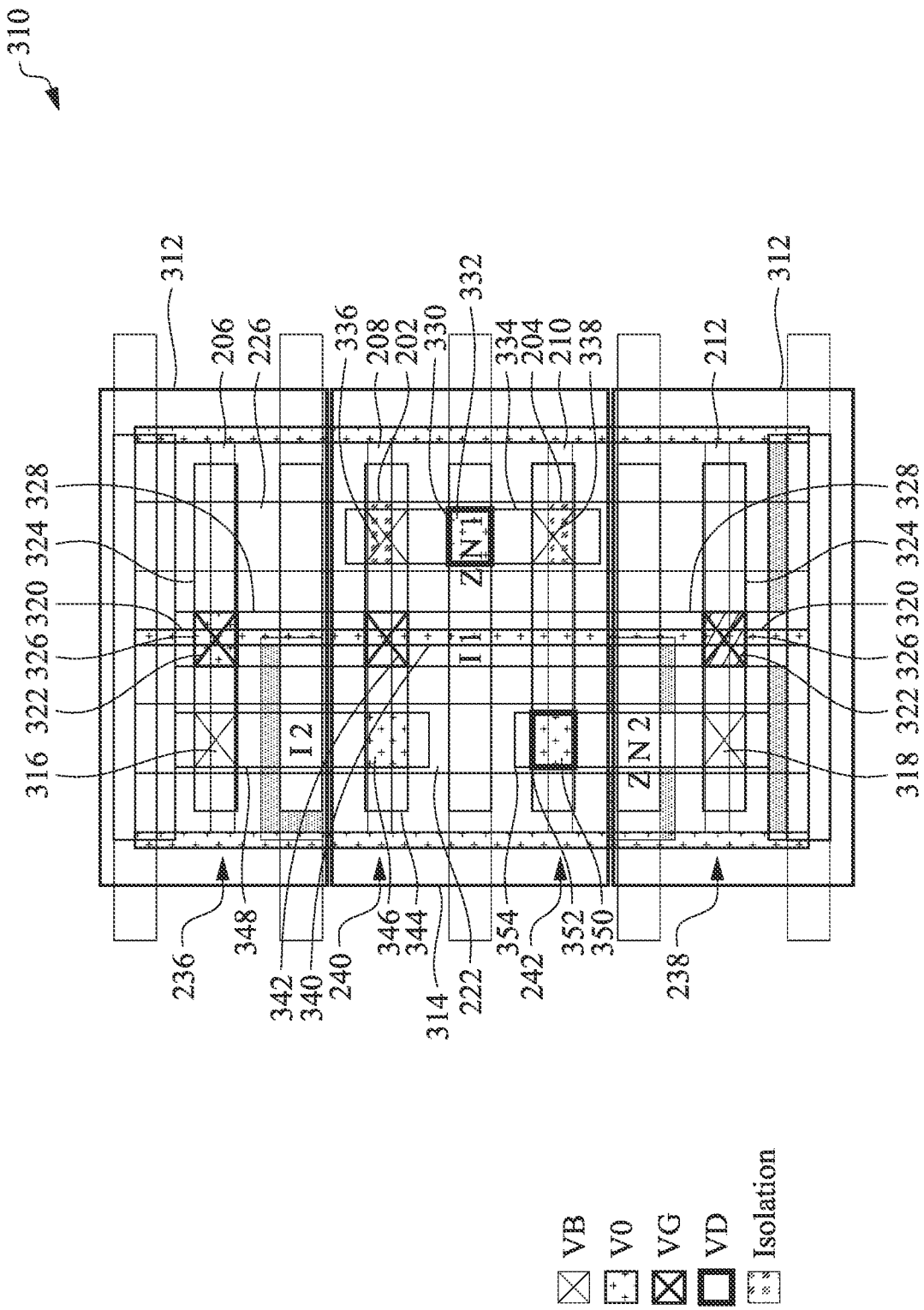
FIG. 8 is a diagram schematically illustrating a split PP/NN cell structure that includes a first inverter and a second inverter, in accordance with some embodiments.

FIG. 8 is a diagram schematically illustrating a split PP/NN cell structure 310 that includes a first inverter 312 and a second inverter 314, in accordance with some embodiments. Each of the first inverter 312 and the second inverter 314 is like the inverter 300 of FIG. 7. Also, the split PP/NN cell structure 310 is like the split PP/NN cell structure 200, such that numerals from the description of the split PP/NN cell structure 200 are used in the description of the split PP/NN cell structure 310 to indicate like elements in the split PP/NN cell structure 310. In addition, the split PP/NN cell structure 310 includes connections for the first inverter 312 and the second inverter 314 in the PP/NN cell structure 310, including gate connections that are separated from one another along the gate contact 216.

The first inverter 312 includes the first transistor 236 and the second transistor 238. In this example, the first transistor 236 is a PMOS transistor and the second transistor 238 is an NMOS transistor. In the first inverter 312, one side of the p-type OD area 206 of the first transistor 236 is electrically connected to power Vdd through a power/reference connection, such as the power/reference connection 256 (shown in FIG. 6), that includes via VB 316. The other side of the p-type OD area 206 is electrically connected to the MD contact 226 that is electrically connected to one side of the n-type OD area 212 of the second transistor 238. The fly MD contact 226 is electrically insulated from the OD area 208 by an insulator situated between the MD contact 226 and the OD area 208 in the isolation area 202, and the fly MD contact 226 is electrically insulated from the OD area 210 by an insulator situated between the MD contact 226 and the OD area 210 in the isolation area 204. The other side of the n-type OD area 212 is electrically connected to a reference Vss through a power/reference connection, such as the power reference connection 256, including VB 318. The gates of the first transistor 236 and the second transistor 238 are electrically coupled to input I1 through gate connections, such as the gate connection 254 (shown in FIG. 6), including a poly contact 320, a via over gate VG 322, first layer metal M0 324, a metal interconnect via V0 326, and a second layer metal M1 328. The output ZN1 of the first inverter 312, which is between the first transistor 236 and the second transistor 238, includes a drain/source connection, such as the drain/source connection 250 (shown in FIG. 6), that includes the MD contact 226 electrically connected to a via over diffusion VD 330, a first layer metal M0 and/or a metal interconnect via V0 332, and a second layer metal M1 334.

The second inverter 314 includes the third transistor 240 and the fourth transistor 242. In this example, the third transistor 240 is a PMOS transistor and the fourth transistor 242 is an NMOS transistor. In the second inverter 314, one side of the p-type OD area 208 of the third transistor 240 is electrically connected to power Vdd through a power/reference connection, such as the power/reference connection 256 (shown in FIG. 6), that includes via VB 336. The other side of the p-type OD area 208 is electrically connected to the MD contact 222 that is electrically connected to one side of the n-type OD area 210 of the fourth transistor 242. The other side of the n-type OD area 210 is electrically connected to a reference Vss through a power/reference connection, such as the power reference connection 256, including VB 338. The gates of the third transistor 240 and the fourth transistor 242 are electrically coupled to input I2 through a gate connection, such as the gate connection 254 (shown in FIG. 6), including a poly contact 340, a via over gate VG 342, first layer metal M0 344, a metal interconnect via V0 346, and a second layer metal M1 348. The output ZN2 of the second inverter 314, which is between the third transistor 240 and the fourth transistor 242, includes a drain/source connection, such as the drain/source connection 250 (shown in FIG. 6), that includes the MD contact 222 electrically connected to a via over diffusion VD 350, a first layer metal M0 and/or a metal interconnect via V0 352, and a second layer metal M1 354.

Figure 9:
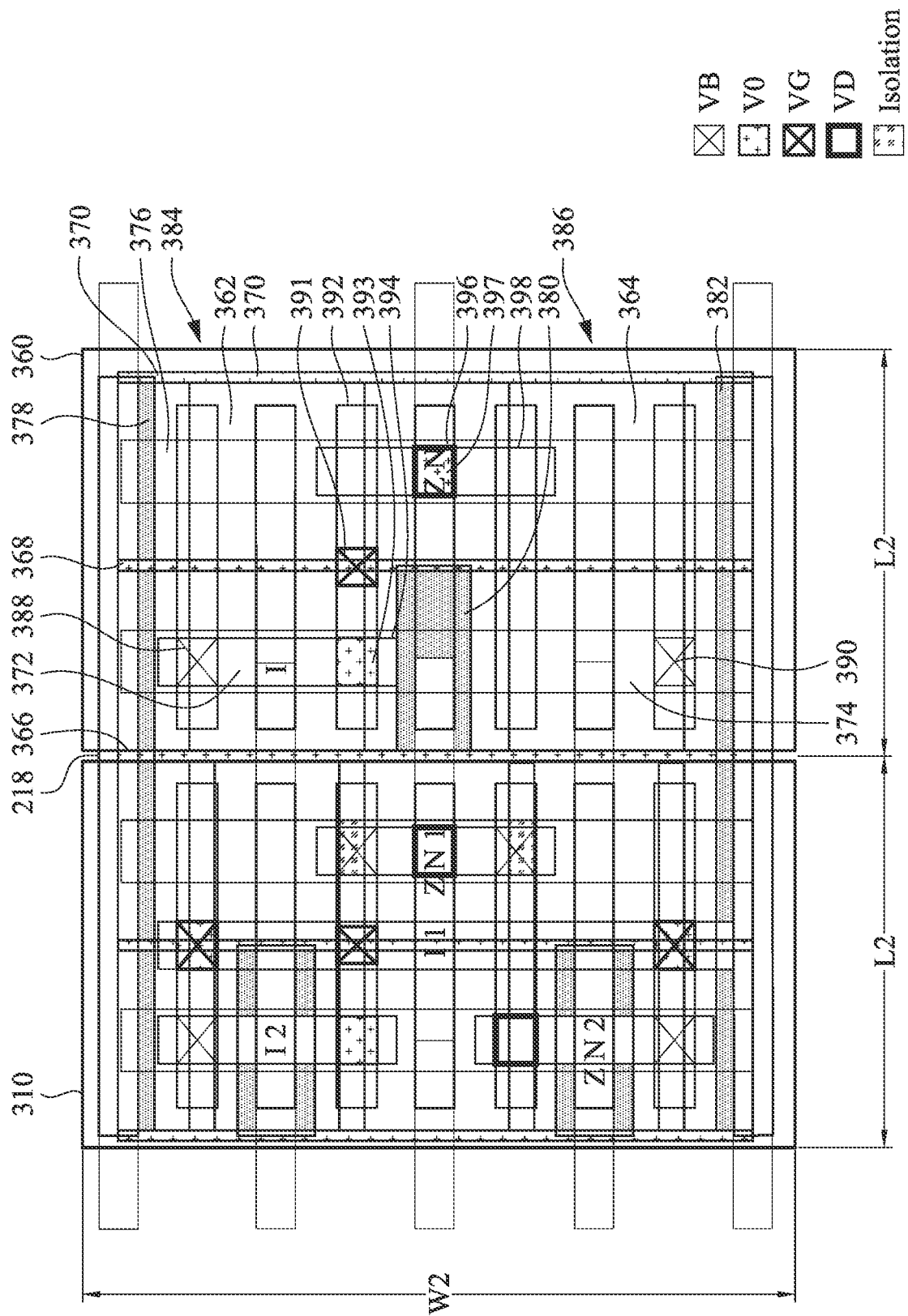
FIG. 9 is a diagram schematically illustrating the split PP/NN cell structure of FIG. 8 directly abutting a PPNN cell structure, in accordance with some embodiments.

FIG. 9 is a diagram schematically illustrating the split PP/NN cell structure 310 directly abutting a PPNN cell structure 360, in accordance with some embodiments. The split PP/NN cell structure 310 has a cell size that is the same as the cell size of the PPNN cell structure 360. The split PP/NN cell structure 310 has a length L2 and a width W2 and the PPNN cell structure 360 has the same length L2 and width W2. Also, the split PP/NN cell structure 310 includes two inverters 312 and 314, while the PPNN cell structure 360 includes only one inverter, such that using the split PP/NN cell structure 310 increases the logic density of an IC.

The PPNN cell structure 360 includes two OD areas 362 and 364 extending in a first direction and three gate contacts 366, 368, and 370 extending in a second direction that intersects the first direction. In some embodiments, the first direction is perpendicular to the second direction. In some embodiments, the gate contacts 366, 368, and 370 include polycrystalline silicon. In some embodiments, the two OD areas 362 and 364 include one p-type OD area 362 and one n-type OD area 364. In some embodiments, the gate contact 366 is shared with the gate contact 218 of the split PP/NN cell structure 310. In some embodiments, the gate contacts 366 and 218 are dummy gate contacts.

The PPNN cell structure 360 includes MD contacts 372, 374, and 376 extending in the second direction. The PPNN cell structure 360 also includes CMD areas 378, 380 and 382. The CMD area 380 is situated between the MD contacts 372 and 374 to separate the MD contacts 372 and 374 from each other. The CMD areas 378 and 382 are situated at opposing ends of the PPNN cell structure 360 to cut off the MD contacts 372 and 376 at one end and to cut off the MD contacts 374 and 376 at the other end.

The MD contacts 372, 374, and 376 are electrically connected to one or more of the OD areas 362 and 364. The MD contact 372 is electrically connected to the OD area 362, and the MD contact 374 is electrically connected to the OD area 364. The MD contact 376 is electrically connected to each of the OD areas 362 and 364 to electrically connect the OD areas 362 and 364 together.

The PPNN cell structure 360 includes a first transistor 384 that includes the OD area 362 electrically connected to the OD area 364 of a second transistor 386 by the MD contact 376. The gate contact 368 is the gate contact for each of the transistors 384 and 386. In some embodiments, the PPNN cell structure 360 can be used in a planar FET device. In some embodiments, the PPNN cell structure 360 can be used in a finFET device. In some embodiments, the PPNN cell structure 360 can be used in a nano sheet device.

The PPNN cell structure 360 includes one inverter like the inverter 300 of FIG. 7. The inverter includes the first transistor 384 and the second transistor 386. In this example, the first transistor 384 is a PMOS transistor and the second transistor 386 is an NMOS transistor. In the inverter, one side of the p-type OD area 362 is electrically connected to power Vdd through a power/reference connection, such as the power/reference connection 256 (shown in FIG. 6), that includes via VB 388. The other side of the p-type OD area 362 is electrically connected to the MD contact 376 that is electrically connected to one side of the n-type OD area 364 of the second transistor 386. The other side of the n-type OD area 364 is electrically connected to a reference Vss through a power/reference connection, such as the power reference connection 256, including VB 390. The gates of the first transistor 384 and the second transistor 386 are electrically coupled to input I through gate connections, such as the gate connection 254 (shown in FIG. 6), including the poly gate contact 368, a via over gate VG 391, first layer metal M0 392, a metal interconnect via V0 393, and a second layer metal M1 394. The output ZN of the inverter, which is between the first transistor 384 and the second transistor 386, includes a drain/source connection, such as the drain/source connection 250 (shown in FIG. 6), that includes the MD contact 374 electrically connected to a via over diffusion VD 396, a first layer metal M0 and/or a metal interconnect via V0 397, and a second layer metal M1 398.

The split PP/NN cell structure 310 has a cell size that is the same as the cell size of the PPNN cell structure 360, and the gate contact 366 is shared with the gate contact 218 of the split PP/NN cell structure 310, such that the split PP/NN cell structure 310 directly abuts the PPNN cell structure 360 without having a spacer situated between the split PP/NN cell structure 310 and the PPNN cell structure 360. This increases the logic density in the IC. Also, the split PP/NN cell structure 310 includes two inverters 312 and 314, while the PPNN cell structure 360 includes only one inverter, which increases the logic density of the IC.

Figure 10:
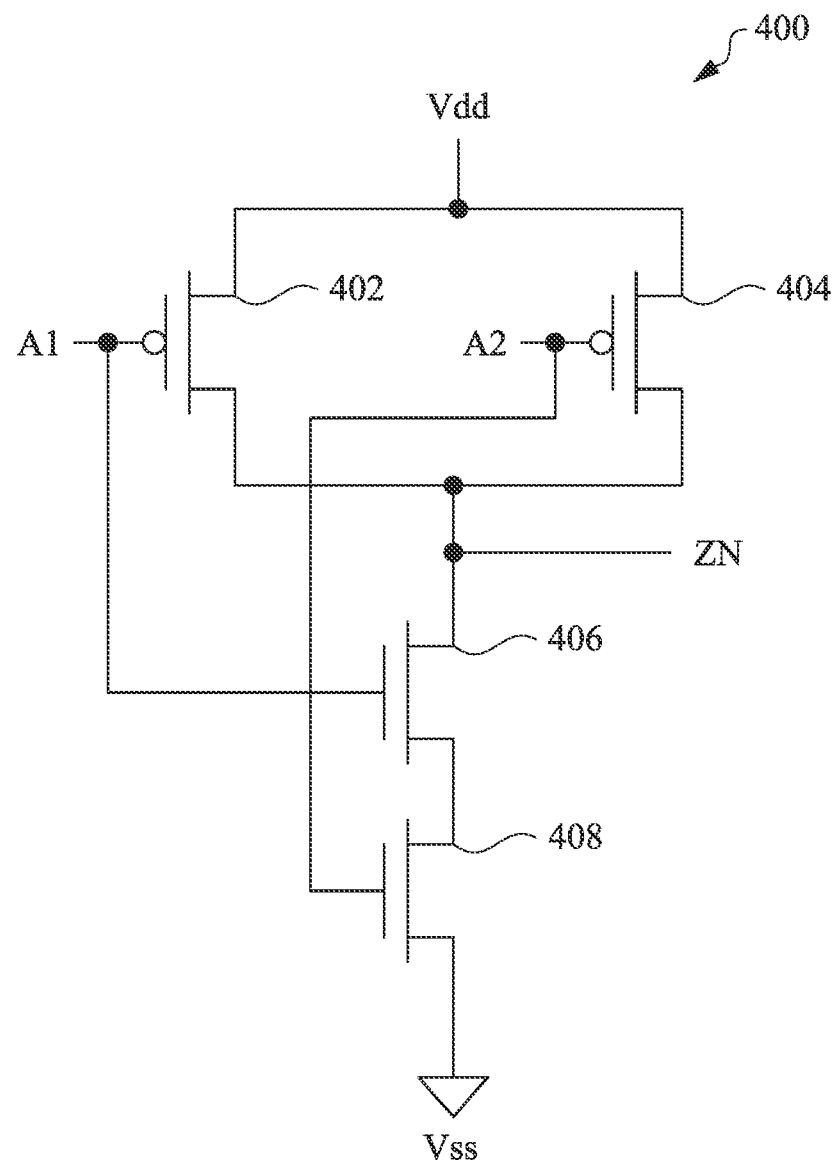
FIG. 10 is a diagram schematically illustrating a 2-input Nand gate, in accordance with some embodiments.

FIG. 10 is a diagram schematically illustrating a 2-input Nand gate 400, in accordance with some embodiments. The 2-input Nand gate 400 receives inputs A1 and A2 and provides a Nand function output ZN. In some embodiments, a split PP/NN cell structure includes two of the 2-input Nand gates 400, while a PPNN cell structure of the same size can include only one 2-input Nand gate 400.

The 2-input Nand gate 400 includes two PMOS transistors 402 and 404 electrically coupled in parallel to each other and two NMOS transistors 406 and 408 electrically coupled in series to each other. The parallel coupled PMOS transistors 402 and 404 are electrically coupled in series to the series coupled NMOS transistors 406 and 408 at the output ZN.

One drain/source region of the PMOS transistor 402 and one drain/source region of the PMOS transistor 404 are electrically connected to power Vdd. The other drain/source region of the PMOS transistor 402 is electrically connected to the other drain/source region of the PMOS transistor 404 and to the output ZN and one drain/source region of the NMOS transistor 406. The other drain/source region of the NMOS transistor 406 is electrically connected to one drain/source region of the NMOS transistor 408. Also, the other drain/source region of the NMOS transistor 408 is electrically connected to a reference Vss, such as ground. The gate of the PMOS transistor 402 is electrically connected to the gate of the NMOS transistor 406 and configured to receive the input A1. The gate of the PMOS transistor 404 is electrically connected to the gate of the NMOS transistor 408 and configured to receive the input A2.

Figure 11:
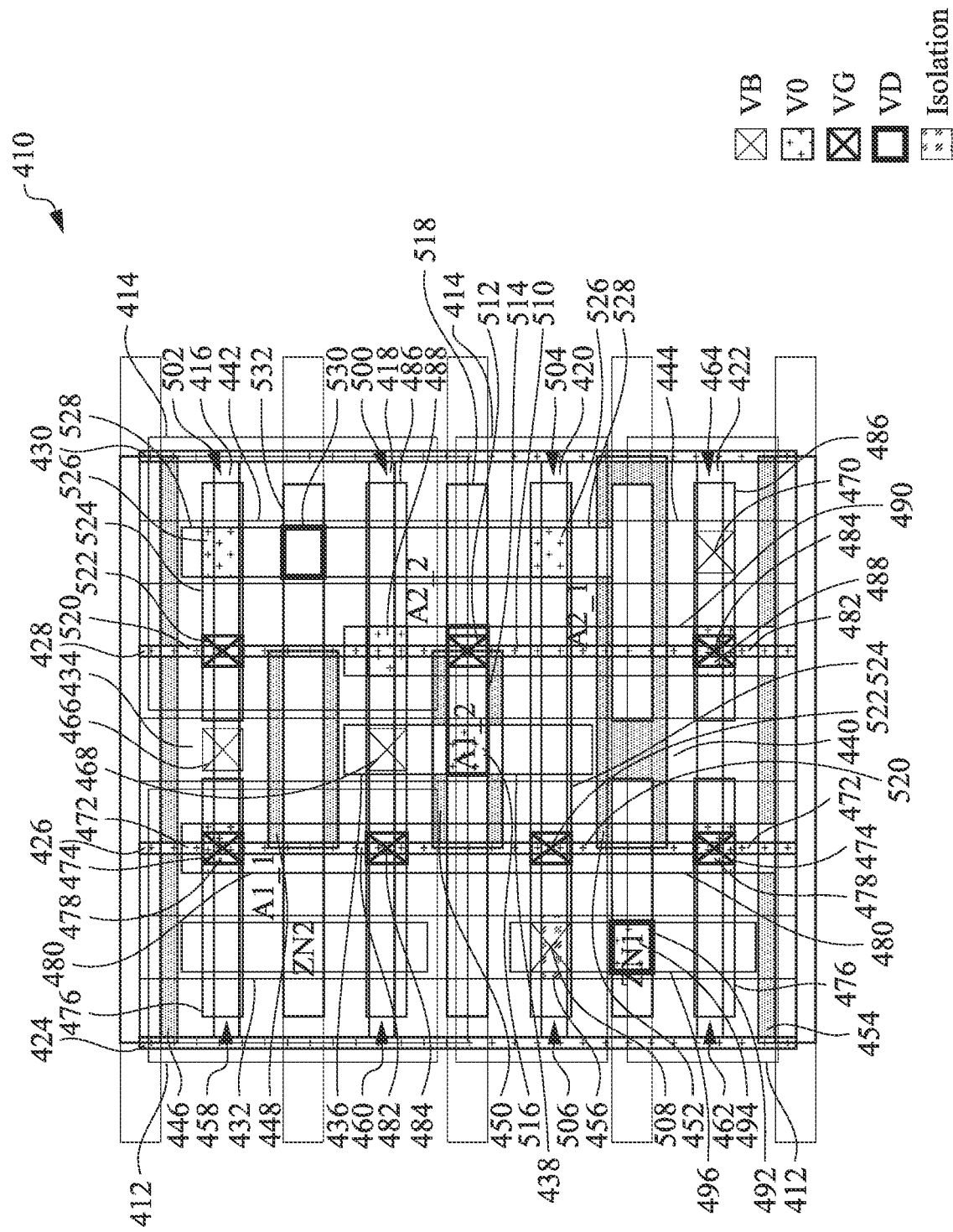
FIG. 11 is a diagram schematically illustrating a split PP/NN cell structure that includes a first 2-input Nand gate and a second 2-input Nand gate, in accordance with some embodiments.

FIG. 11 is a diagram schematically illustrating a split PP/NN cell structure 410 that includes a first 2-input Nand gate 412 and a second 2-input Nand gate 414, in accordance with some embodiments. Each of the first 2-input Nand gate 412 and the second 2-input Nand gate 414 is like the 2-input Nand gate 400 of FIG. 10.

The split PP/NN cell structure 410 includes four OD areas 416, 418, 420, and 422 extending in a first direction and four gate contacts 424, 426, 428, and 430 extending in a second direction that intersects the first direction. The four OD areas 416, 418, 420, and 422 include two p-type OD areas 416 and 418 and two n-type OD areas 420 and 422. In some embodiments, the first direction is perpendicular to the second direction. In some embodiments, the gate contacts 424, 426, 428, and 430 include polycrystalline silicon, also referred to as polysilicon or poly.

The split PP/NN structure 410 includes MD contacts 432, 434, 436, 438, 440, 442, and 444 extending in the second direction. The split PP/NN structure 410 also includes CMD areas 446, 448, 450, 452, and 454. The CMD area 448 is situated between the MD contacts 434 and 436 to separate the MD contacts 434 and 436 from each other, the CMD area 450 is situated between the MD contacts 436 and 438 to separate the MD contacts 436 and 438 from each other, and the CMD area 452 is situated between the MD contacts 438 and 440 and between MD contacts 442 and 444 to separate the MD contacts 438 and 440 from each other and to separate the MD contacts 442 and 444 from each other. The CMD areas 446 and 454 are situated at opposing ends of the split PP/NN structure 410 to cut off the MD contacts 432, 434, and 442 at one end and to cut off the MD contacts 432, 440, and 444 at the other end.

The MD contacts 432, 434, 436, 438, 440, 442, and 444 are electrically connected to one or more of the OD areas 416, 418, 420, and 422. The MD contact 434 is electrically connected to the OD area 416, the MD contact 436 is electrically connected to the OD area 418, the MD contact 438 is electrically connected to the OD area 420, the MD contact 440 is electrically connected to the OD area 422, and the MD contact 444 is electrically connected to the OD area 422. The MD contact 442 is electrically connected to each of the OD areas 416, 418, and 420, which electrically connects the OD areas 416, 418, and 420 together at the MD contact 442.

The MD contact 432 is electrically connected to each of the OD areas 416, 418, and 422, which electrically connects the OD areas 416, 418, and 422 together at the MD contact 432. The MD contact 432 is electrically insulated from the OD area 420 by an insulator situated between the MD contact 432 and the OD area 420 in isolation area 456. In the isolation area 456, the MD contact 432 is referred to as a fly MD contact, which enables providing more logic gates and functions in the split PP/NN cell structure 410.

In some embodiments, the split PP/NN cell structure 410 can be used in a planar FET device. In some embodiments, the split PP/NN cell structure 410 can be used in a finFET device. In some embodiments, the split PP/NN cell structure 410 can be used in a nano sheet device.

The first 2-input Nand gate 412 includes a first PMOS transistor 458, a second PMOS transistor 460, a first NMOS transistor 462, and a second NMOS transistor 464. In the first 2-input Nand gate 412, one side of the p-type OD area 416 of the first PMOS transistor 458 is electrically connected to power Vdd through a power/reference connection, such as the power/reference connection 256 (shown in FIG. 6), that includes via VB 466. Also, one side of the p-type OD area 418 of the second PMOS transistor 460 is electrically connected to power Vdd through a power/reference connection, such as the power/reference connection 256 (shown in FIG. 6), that includes via VB 468. The other side of the p-type OD area 416 of the first PMOS transistor 458 and the other side of the p-type OD area 418 of the second PMOS transistor 460 are electrically connected to the MD contact 432 that is electrically connected to one side of the n-type OD area 422 of the first NMOS transistor 462. The fly MD contact 432 is electrically insulated from the OD area 420 by the insulator situated between the MD contact 432 and the OD area 420 in the isolation area 456. The other side of the n-type OD area 422 of the first NMOS transistor 462 is electrically connected to one side of the n-type OD area 422 of the second NMOS transistor 464. The other side of the n-type OD area 422 of the second NMOS transistor 464 is electrically connected to a reference Vss through a power/reference connection, such as the power reference connection 256, including VB 470.

The gates of the first PMOS transistor 458 and the first NMOS transistor 462 are electrically coupled to input A1_1 through gate connections, such as the gate connection 254 (shown in FIG. 6), including a poly contact 472, a via over gate VG 474, a first layer metal M0 476 and/or a metal interconnect via V0 478, and a second layer metal M1 480. The gates of the second PMOS transistor 460 and the second NMOS transistor 464 are electrically coupled to input A2_1 through gate connections, such as the gate connection 254 (shown in FIG. 6), including a poly contact 482, a via over gate VG 484, a first layer metal M0 486 and/or a metal interconnect via V0 488, and a second layer metal M1 490. The output ZN1 of the first 2-input Nand gate 412, includes a drain/source connection, such as the drain/source connection 250 (shown in FIG. 6), that includes the MD contact 432 electrically connected to a via over diffusion VD 492, a first layer metal M0 and/or a metal interconnect via V0 494, and a second layer metal M1 496.

The second 2-input Nand gate 414 includes a first PMOS transistor 500, a second PMOS transistor 502, a first NMOS transistor 504, and a second NMOS transistor 506. In the second 2-input input Nand gate 414, one side of the p-type OD area 418 of the first PMOS transistor 500 is electrically connected to power Vdd through a power/reference connection, such as the power/reference connection 256 (shown in FIG. 6), that includes via VB 468. Also, one side of the p-type OD area 416 of the second PMOS transistor 502 is electrically connected to power Vdd through a power/reference connection, such as the power/reference connection 256 (shown in FIG. 6), that includes via VB 466. The other side of the p-type OD area 418 of the first PMOS transistor 500 and the other side of the p-type OD area 416 of the second PMOS transistor 502 are electrically connected to the MD contact 442 that is electrically connected to one side of the n-type OD area 420 of the first NMOS transistor 504. The other side of the n-type OD area 420 of the first NMOS transistor 504 is electrically connected to one side of the n-type OD area 420 of the second NMOS transistor 506. The other side of the n-type OD area 420 of the second NMOS transistor 506 is electrically connected to a reference Vss through a power/reference connection, such as the power reference connection 256, including VB 508.

The gates of the first PMOS transistor 500 and the first NMOS transistor 504 are electrically coupled to input A1_2 through a gate connection, such as the gate connection 254 (shown in FIG. 6), including a poly contact 510, a via over gate VG 512, a first layer metal M0 514, a metal interconnect via V0 516, and a second layer metal M1 518. The gates of the second PMOS transistor 502 and the second NMOS transistor 506 are electrically coupled to input A2_2 through gate connections, such as the gate connection 254 (shown in FIG. 6), including a poly contact 520, a via over gate VG 522, a first layer metal M0 524, a metal interconnect via V0 526, and a second layer metal M1 528. The output ZN2 of the second 2-input Nand gate 414, includes a drain/source connection, such as the drain/source connection 250 (shown in FIG. 6), that includes the MD contact 442 electrically connected to a via over diffusion VD 530 connected to a second layer metal M1 532.

Figure 12:
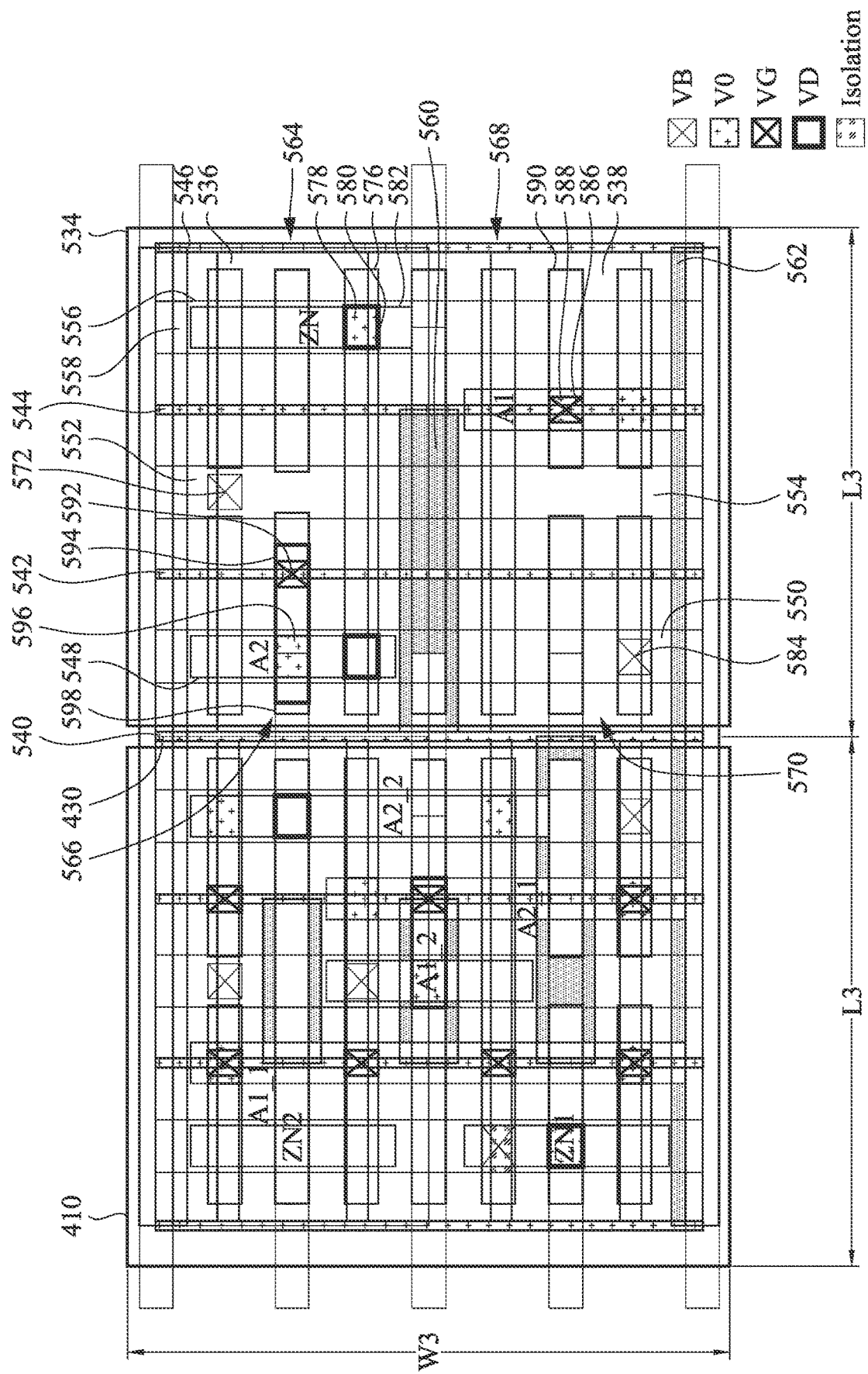
FIG. 12 is a diagram schematically illustrating the split PP/NN cell structure of FIG. 11 directly abutting a PPNN cell structure, in accordance with some embodiments.

FIG. 12 is a diagram schematically illustrating the split PP/NN cell structure 410 directly abutting a PPNN cell structure 534, in accordance with some embodiments. The split PP/NN cell structure 410 has a cell size that is the same as the cell size of the PPNN cell structure 534. The split PP/NN cell structure 410 has a length L3 and a width W3 and the PPNN cell structure 534 has the same length L3 and width W3. Also, the split PP/NN cell structure 410 includes two 2-input Nand gates 412 and 414, while the PPNN cell structure 534 includes only one 2-input Nand gate, such that using the split PP/NN cell structure 410 increases the logic density of an IC.

The PPNN cell structure 534 includes two OD areas 536 and 538 extending in a first direction and four gate contacts 540, 542, 544, and 546 extending in a second direction that intersects the first direction. The two OD areas 536 and 538 include one p-type OD area 536 and one n-type OD area 538. In some embodiments, the first direction is perpendicular to the second direction. In some embodiments, the gate contacts 540, 542, 544, and 546 include polycrystalline silicon. In some embodiments, the gate contact 540 is shared with the gate contact 430 of the split PP/NN cell structure 410. In some embodiments, the gate contacts 540 and 430 are dummy gate contacts.

The PPNN cell structure 534 includes MD contacts 548, 550, 552, 554, and 556 extending in the second direction. The PPNN cell structure 534 also includes CMD areas 558, 560, and 562. The CMD area 560 is situated between the MD contacts 548 and 550 to separate the MD contacts 548 and 550 from each other and between the MD contacts 552 and 554 to separate the MD contacts 552 and 554 from each other. The CMD areas 558 and 562 are situated at opposing ends of the PPNN cell structure 534 to cut off the MD contacts 548, 552, and 556 at one end and to cut off the MD contacts 550, 554, and 556 at the other end.

The MD contacts 548, 550, 552, 554, and 556 are electrically connected to one or more of the OD areas 536 and 538. Each of the MD contacts 548 and 552 is electrically connected to the OD area 536, and each of the MD contacts 550 and 554 is electrically connected to the OD area 538. The MD contact 556 is electrically connected to each of the OD areas 536 and 538 to electrically connect the OD areas 536 and 538 together.

The 2-input Nand gate in the PPNN cell structure 534 includes a first PMOS transistor 564, a second PMOS transistor 566, a first NMOS transistor 568, and a second NMOS transistor 570. One side of the p-type OD area 536 of the first PMOS transistor 564 and of the second PMOS transistor 566 is electrically connected to power Vdd through a power/reference connection, such as the power/reference connection 256 (shown in FIG. 6), that includes via VB 572. The other side of the p-type OD area 536 of the first PMOS transistor 564 is electrically connected to the other side of the p-type OD area 536 of the second PMOS transistor 566 through a drain/source via VD 574, a first layer metal M0 576 and a drain/source connection, such as the drain/source connection 250 (shown in FIG. 6), that includes the MD contact 556 electrically connected to a via over diffusion VD 578, the first layer metal M0 576, a metal interconnect via V0 580, and a second layer metal M1 582 at the output ZN of the 2-input Nand gate. The MD contact 556 is further electrically connected to one side of the n-type OD area 538 of the first NMOS transistor 568. The other side of the n-type OD area 538 of the first NMOS transistor 568 is electrically connected to one side of the n-type OD area 538 of the second NMOS transistor 570. The other side of the n-type OD area 538 of the second NMOS transistor 570 is electrically connected to a reference Vss through a power/reference connection, such as the power reference connection 256, including VB 584.

The gates of the first PMOS transistor 564 and the first NMOS transistor 568 are electrically coupled to input A1 through a gate connection, such as the gate connection 254 (shown in FIG. 6), including a gate contact 544, a via over gate VG 586, a first layer metal M0 and/or a metal interconnect via V0 588, and a second layer metal M1 590. The gates of the second PMOS transistor 566 and the second NMOS transistor 570 are electrically coupled to input A2 through a gate connection, such as the gate connection 254 (shown in FIG. 6), including the gate contact 542, a via over gate VG 592, a first layer metal M0 594, a metal interconnect via V0 596, and a second layer metal M1 598.

The split PP/NN cell structure 410 has a cell size that is the same as the cell size of the PPNN cell structure 534, and the gate contact 540 is shared with the gate contact 430 of the split PP/NN cell structure 410, such that the split PP/NN cell structure 410 directly abuts the PPNN cell structure 534 without having a spacer situated between the split PP/NN cell structure 410 and the PPNN cell structure 534, which increases the logic density in the IC. Also, the split PP/NN cell structure 410 includes two 2-input Nand gates 412 and 414, while the PPNN cell structure 534 includes only one 2-input Nand gate, which increases the logic density of the IC.

Figure 13:
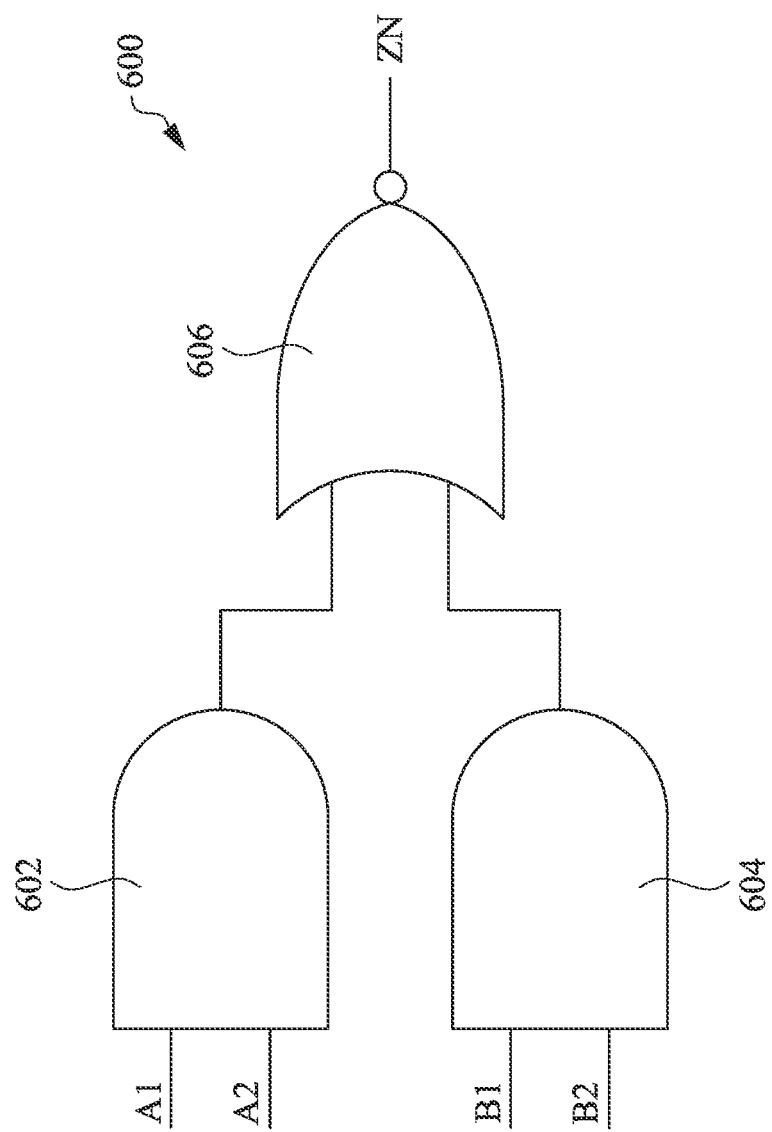
FIG. 13 is a diagram schematically illustrating an And-Or-Invert (AOI) function that can be implemented in a split PP/NN cell structure, in accordance with some embodiments.

FIG. 13 is a diagram schematically illustrating an And-Or-Invert (AOI) function 600 that can be implemented in a split PP/NN cell structure, in accordance with some embodiments. The AOI function 600 includes two 2-input And gates 602 and 604 electrically connected to a 2-input Nor gate 606. This type of AOI function 600 is also referred to as an AOI22. The first And gate 602 receives inputs A1 and A2 and provides an output to one input of the 2-input Nor gate 606. The second And gate 604 receives inputs B1 and B2 and provides an output to the other input of the 2-input Nor gate 606. The 2-input Nor gate provides an output ZN.

FIG. 14 is a diagram schematically illustrating a truth table 608 for the AOI function 600, in accordance with some embodiments. If each of the two And gates 602 and 604 receives at least one 0 input, the output ZN is a 1. If one or both of the two And gates 602 and 604 receive two 1 inputs, the output ZN is a 0.

Figure 15:
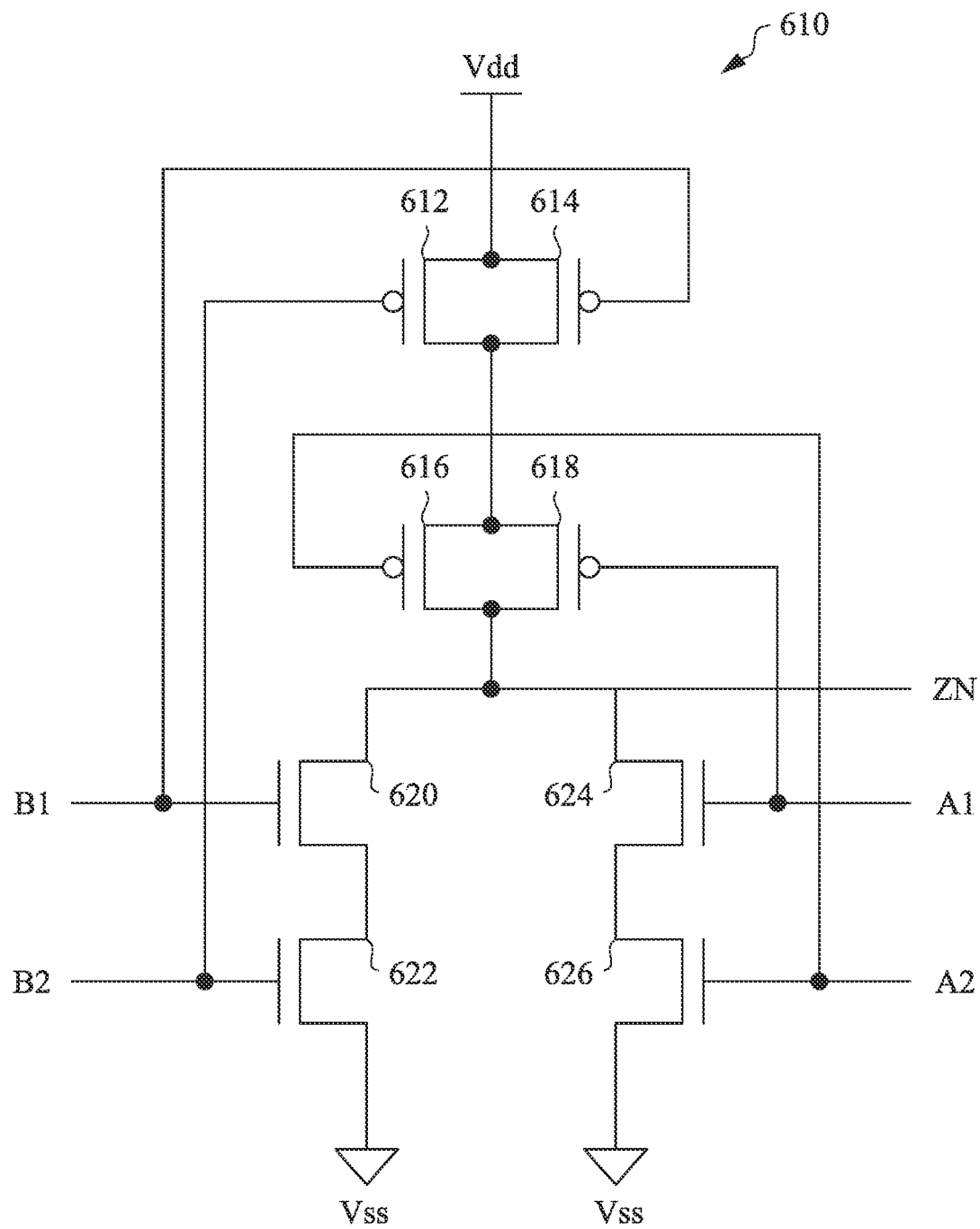
FIG. 15 is a diagram schematically illustrating an AOI22 function that can be implemented in a split PP/NN cell structure, in accordance with some embodiments.

FIG. 15 is a diagram schematically illustrating an AOI22 function 610 that can be implemented in a split PP/NN cell structure, in accordance with some embodiments. The AOI22 function 610 receives the first set of inputs A1 and A2 and the second set of inputs B1 and B2 and provides the output ZN. In some embodiments, a PPNN cell structure includes only one AOI22 function, and a split PP/NN cell structure that is 120% the size of the PPNN cell structure includes two of the AOI22 functions 610.

The AOI22 function 610 includes four PMOS transistors 612, 614, 616, and 618 with PMOS transistors 612 and 614 electrically connected in parallel to each other and PMOS transistors 616 and 618 electrically connected in parallel to each other. The AOI22 function 610 further includes four NMOS transistors 620, 622, 624, and 626 with NMOS transistors 620 and 622 electrically connected in series to each other and NMOS transistors 624 and 626 electrically connected in series to each other. The parallel coupled PMOS transistors 612 and 614 are electrically connected in series to the parallel coupled PMOS transistors 616 and 618 that are electrically connected in series, at the output ZN, to each of the series coupled NMOS transistors 620 and 622 and the series coupled NMOS transistors 624 and 626.

One drain/source region of the PMOS transistor 612 and one drain/source region of the PMOS transistor 614 are electrically connected to power Vdd. The other drain/source region of the PMOS transistor 612 is electrically connected to the other drain/source region of the PMOS transistor 614 and to one drain/source region of the PMOS transistor 616 and one drain/source region of the PMOS transistor 618. The other drain/source region of the PMOS transistor 616 is electrically connected to the other drain/source region of the PMOS transistor 618 and to the output ZN and to one drain/source region of the NMOS transistor 620 and one drain/source region of the NMOS transistor 624. The other drain/source region of the NMOS transistor 620 is electrically connected to one drain/source region of the NMOS transistor 622. Also, the other drain/source region of the NMOS transistor 624 is electrically connected to one drain/source region of the NMOS transistor 626. The other drain/source region of each of the NMOS transistor 622 and the NMOS transistor 626 is electrically connected to a reference Vss, such as ground.

The gate of the NMOS transistor 620 is electrically connected to the gate of the PMOS transistor 614 and configured to receive the input B1. The gate of the NMOS transistor 622 is electrically connected to the gate of the PMOS transistor 612 and configured to receive the input B2. The gate of the NMOS transistor 624 is electrically connected to the gate of the PMOS transistor 618 and configured to receive the input A1. The gate of the NMOS transistor 626 is electrically connected to the gate of the PMOS transistor 616 and configured to receive the input A2.

Figure 16:
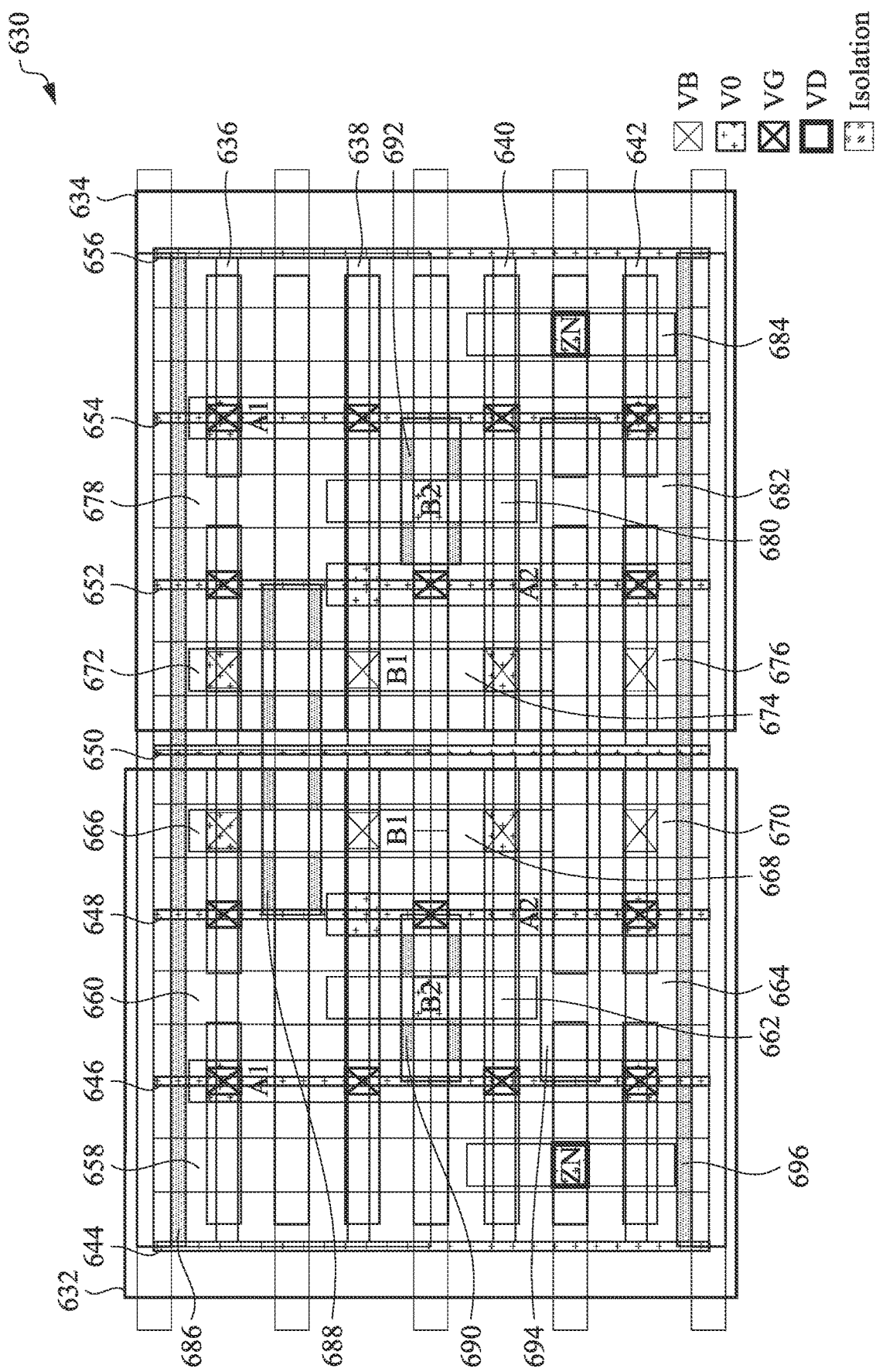
FIG. 16 is a diagram schematically illustrating a split PP/NN cell structure that includes a first AOI22 function and a second AOI22 function, in accordance with some embodiments.

FIG. 16 is a diagram schematically illustrating a split PP/NN cell structure 630 that includes a first AOI22 function 632 and a second AOI22 function 634, in accordance with some embodiments. Each of the first AOI22 function 632 and the second AOI22 function 634 is like the AOI22 function 610 of FIG. 15.

The split PP/NN cell structure 630 includes four OD areas 636, 638, 640, and 642 extending in a first direction and seven gate contacts 644, 646, 648, 650, 652, 654, and 656 extending in a second direction that intersects the first direction. The four OD areas 636, 638, 640, and 642 include two p-type OD areas 636 and 638 and two n-type OD areas 640 and 642. In some embodiments, the first direction is perpendicular to the second direction. In some embodiments, the gate contacts 644, 646, 648, 650, 652, 654, and 656 include polycrystalline silicon, also referred to as polysilicon or poly.

The split PP/NN structure 630 includes MD contacts 658, 660, 662, 664, 666, 668, 670, 672, 674, 676, 678, 680, 682, and 684 extending in the second direction. The split PP/NN structure 630 also includes CMD areas 686, 688, 690, 692, 694, and 696. The CMD area 688 is situated between the MD contacts 666 and 668 to separate the MD contacts 666 and 668 from each other and between the MD contacts 672 and 674 to separate the MD contacts 672 and 674 from each other. The CMD area 690 is situated between the MD contacts 660 and 662 to separate the MD contacts 660 and 662 from each other, and the CMD area 692 is situated between the MD contacts 678 and 680 to separate the MD contacts 678 and 680 from each other. The CMD area 694 is situated between the MD contacts 662 and 664 to separate the MD contacts 662 and 664 from each other, between the MD contacts 668 and 670 to separate the MD contacts 668 and 670 from each other, between the MD contacts 674 and 676 to separate the MD contacts 674 and 676 from each other, and between the MD contacts 680 and 682 to separate the MD contacts 680 and 682 from each other. The CMD areas 686 and 696 are situated at opposing ends of the split PP/NN structure 630 to cut off the MD contacts 658, 660, 666, 672, 678, and 684 at one end and to cut off the MD contacts 658, 664, 670, 676, 682, and 684 at the other end.

The MD contacts 658, 660, 662, 664, 666, 668, 670, 672, 674, 676, 678, 680, 682, and 684 are electrically connected to one or more of the OD areas 636, 638, 640, and 642. The MD contact 658 is electrically connected to each of the OD areas 636, 638, 640, and 642, which electrically connects the OD areas 636, 638, 640, and 642 together at the MD contact 658. Also, the MD contact 684 is electrically connected to each of the OD areas 636, 638, 640, and 642, which electrically connects the OD areas 636, 638, 640, and 642 together at the MD contact 684. The MD contact 660 is electrically connected to the OD areas 636 and 638, which electrically connects the OD areas 636 and 638 together at the MD contact 660, and the MD contact 678 is electrically connected to the OD areas 636 and 638, which electrically connects the OD areas 636 and 638 together at the MD contact 678. The MD contact 662 is electrically connected to the OD area 640, the MD contact 664 is electrically connected to the OD area 642, the MD contact 680 is electrically connected to the OD area 640, and the MD contact 682 is electrically connected to the OD area 642. Also, the MD contact 666 is electrically connected to the OD area 636, the MD contact 670 is electrically connected to the OD area 642, the MD contact 672 is electrically connected to the OD area 636, and the MD contact 676 is electrically connected to the OD area 642. In addition, the MD contact 668 is electrically connected to the OD areas 638 and 640, which electrically connects the OD areas 638 and 640 together at the MD contact 668, and the MD contact 674 is electrically connected to the OD areas 638 and 640, which electrically connects the OD areas 638 and 640 together at the MD contact 674.

In some embodiments, the split PP/NN cell structure 630 can be used in a planar FET device. In some embodiments, the split PP/NN cell structure 630 can be used in a finFET device. In some embodiments, the split PP/NN cell structure 630 can be used in a nano sheet device.

Figure 17:
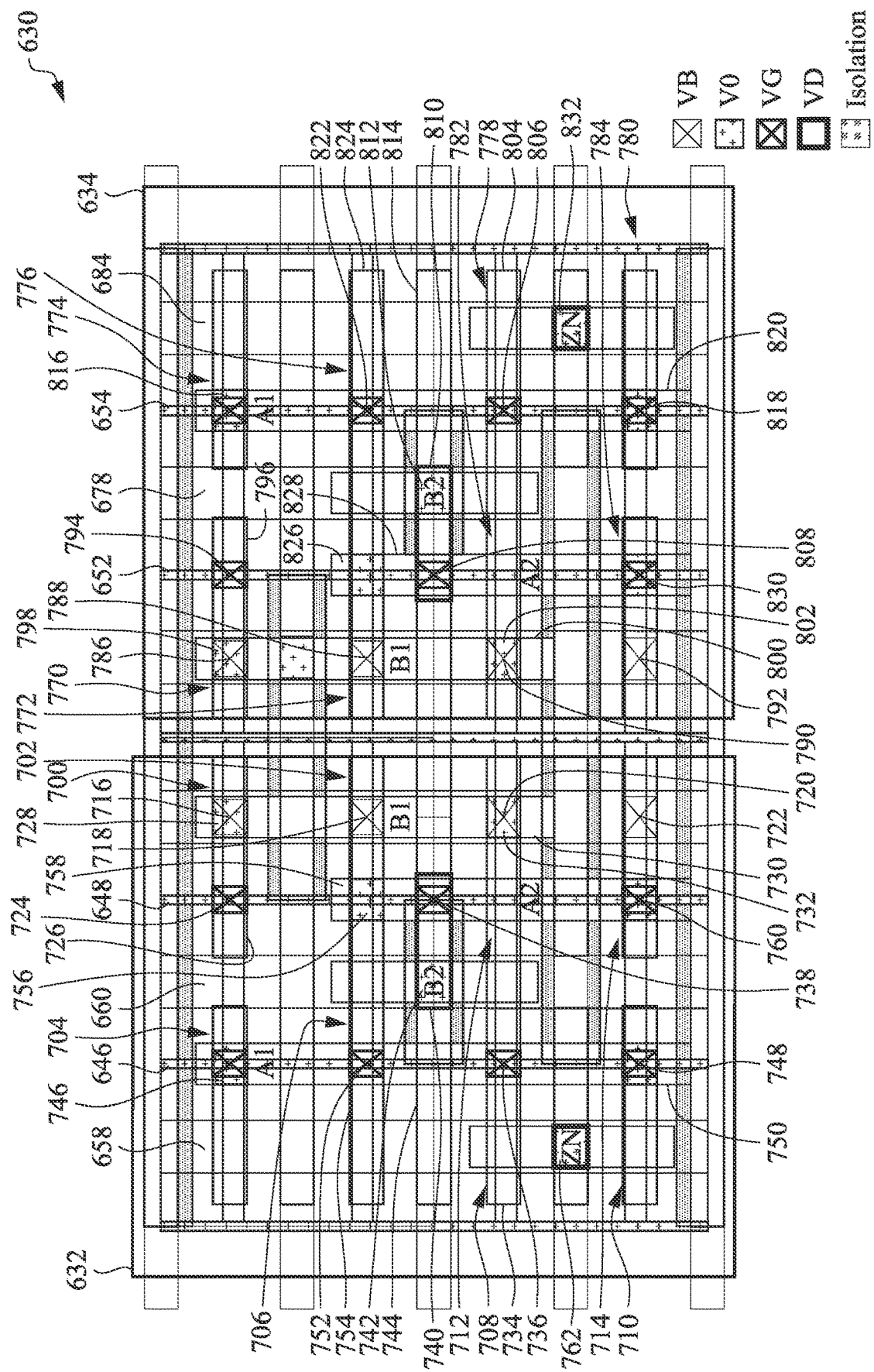
FIG. 17 is a diagram schematically illustrating the connections in the split PP/NN cell structure for the first AOI22 function and for the second AOI22 function, in accordance with some embodiments.

FIG. 17 is a diagram schematically illustrating the connections in the split PP/NN cell structure 630 for the first AOI22 function 632 and for the second AOI22 function 634, in accordance with some embodiments. The split PP/NN cell structure 630 of FIG. 17 is the same as the split PP/NN cell structure 630 of FIG. 16, including the same OD areas 636, 638, 640, and 642, gate contacts 644, 646, 648, 650, 652, 654, and 656, MD contacts 658, 660, 662, 664, 666, 668, 670, 672, 674, 676, 678, 680, 682, and 684, and CMD areas 686, 688, 690, 692, 694, and 696. However, the reference numerals in FIG. 16 may not be repeated in FIG. 17 to improve clarity.

The first AOI22 function 632 includes a first PMOS transistor 700, a second PMOS transistor 702, a third PMOS transistor 704, a fourth PMOS transistor 706, a first NMOS transistor 708, a second NMOS transistor 710, a third NMOS transistor 712, and a fourth NMOS transistor 714. In the first AOI22 function 632, one side of the p-type OD area 636 of the first PMOS transistor 700 is electrically connected to power Vdd through a power/reference connection, such as the power/reference connection 256 (shown in FIG. 6), that includes via VB 716. Also, one side of the p-type OD area 638 of the second PMOS transistor 702 is electrically connected to power Vdd through a power/reference connection, such as the power/reference connection 256 (shown in FIG. 6), that includes via VB 718. The other side of the p-type OD area 636 of the first PMOS transistor 700 and the other side of the p-type OD area 638 of the second PMOS transistor 702 are electrically connected to the MD contact 660 that is electrically connected to one side of the p-type OD area 636 of the third PMOS transistor 704 and to one side of the p-type OD area 638 of the fourth PMOS transistor 706. The other side of the p-type OD area 636 of the third PMOS transistor 704 and the other side of the p-type OD area 638 of the fourth PMOS transistor 706 are electrically connected to the MD contact 658 at the output Zn that is electrically connected to one side of the n-type OD area 640 of the first NMOS transistor 708 and to one side of the n-type OD area 642 of the second NMOS transistor 710. The other side of the n-type OD area 640 of the first NMOS transistor 708 is electrically connected to one side of the n-type OD area 640 of the third NMOS transistor 712 and the other side of the n-type OD area 640 of the third NMOS transistor 712 is electrically connected to a reference Vss through a power/reference connection, such as the power reference connection 256, including VB 720. The other side of the n-type OD area 642 of the second NMOS transistor 710 is electrically connected to one side of the n-type OD area 642 of the fourth NMOS transistor 714 and the other side of the n-type OD area 642 of the fourth NMOS transistor 714 is electrically connected to a reference Vss through a power/reference connection, such as the power reference connection 256, including VB 722.

The gates of the first PMOS transistor 700 and the first NMOS transistor 708 are electrically coupled to input B1 through gate connections, such as the gate connection 254 (shown in FIG. 6), including a poly gate contact 648, a via over gate VG 724, a first layer metal M0 726, a metal interconnect via V0 728, and a second layer metal M1 730 to another metal interconnect via V0 732, first layer metal M0 734, via over gate VG 736, and poly gate contact 646. The gates of the second PMOS transistor 702 and the third NMOS transistor 712 are electrically coupled to input B2 through gate connections, such as the gate connection 254 (shown in FIG. 6), including a poly gate contact 648, a via over gate VG 738, a first layer metal M0 740, a metal interconnect via V0 742, and a second layer metal M1 744.

The gates of the third PMOS transistor 704 and the second NMOS transistor 710 are electrically coupled to input A1 through gate connections 746 and 748, such as the gate connection 254 (shown in FIG. 6), including a poly gate contact, a via over gate VG, a first layer metal M0 and/or a metal interconnect via V0, which are not numbered for clarity, and a second layer metal M1 750. The gates of the fourth PMOS transistor 706 and the fourth NMOS transistor 714 are electrically coupled to input A2 through gate connections, such as the gate connection 254 (shown in FIG. 6), including poly gate contact 646, a via over gate VG 752, a first layer metal M0 754, a metal interconnect via V0 756, and a second layer metal M1 758 to another metal interconnect via V0, first layer metal M0, which are not numbered for clarity, and via over gate VG 760 and poly gate contact 648.

The output ZN of the first AOI22 function 632 includes a drain/source connection 762, such as the drain/source connection 250 (shown in FIG. 6), that includes the MD contact 658 electrically connected to a via over diffusion VD, a first layer metal M0 and/or a metal interconnect via V0, and a second layer metal M1, which are not numbered for clarity.

The second AOI22 function 634 includes a first PMOS transistor 770, a second PMOS transistor 772, a third PMOS transistor 774, a fourth PMOS transistor 776, a first NMOS transistor 778, a second NMOS transistor 780, a third NMOS transistor 782, and a fourth NMOS transistor 784. In the second AOI22 function 634, one side of the p-type OD area 636 of the first PMOS transistor 770 is electrically connected to power Vdd through a power/reference connection, such as the power/reference connection 256 (shown in FIG. 6), that includes via VB 786. Also, one side of the p-type OD area 638 of the second PMOS transistor 772 is electrically connected to power Vdd through a power/reference connection, such as the power/reference connection 256 (shown in FIG. 6), that includes via VB 788. The other side of the p-type OD area 636 of the first PMOS transistor 770 and the other side of the p-type OD area 638 of the second PMOS transistor 772 are electrically connected to the MD contact 678 that is electrically connected to one side of the p-type OD area 636 of the third PMOS transistor 774 and to one side of the p-type OD area 638 of the fourth PMOS transistor 776. The other side of the p-type OD area 636 of the third PMOS transistor 774 and the other side of the p-type OD area 638 of the fourth PMOS transistor 776 are electrically connected to the MD contact 684 at the output Zn that is electrically connected to one side of the n-type OD area 640 of the first NMOS transistor 778 and to one side of the n-type OD area 642 of the second NMOS transistor 780. The other side of the n-type OD area 640 of the first NMOS transistor 778 is electrically connected to one side of the n-type OD area 640 of the third NMOS transistor 782 and the other side of the n-type OD area 640 of the third NMOS transistor 782 is electrically connected to a reference Vss through a power/reference connection, such as the power reference connection 256, including VB 790. The other side of the n-type OD area 642 of the second NMOS transistor 780 is electrically connected to one side of the n-type OD area 642 of the fourth NMOS transistor 784 and the other side of the n-type OD area 642 of the fourth NMOS transistor 784 is electrically connected to a reference Vss through a power/reference connection, such as the power reference connection 256, including VB 792.

The gates of the first PMOS transistor 770 and the first NMOS transistor 778 are electrically coupled to input B1 through gate connections, such as the gate connection 254 (shown in FIG. 6), including a poly gate contact 652, a via over gate VG 794, a first layer metal M0 796, a metal interconnect via V0 798, and a second layer metal M1 800 to another metal interconnect via V0 802, first layer metal M0 804, via over gate VG 806, and poly gate contact 654. The gates of the second PMOS transistor 772 and the third NMOS transistor 782 are electrically coupled to input B2 through gate connections, such as the gate connection 254 (shown in FIG. 6), including a poly gate contact 652, a via over gate VG 808, a first layer metal M0 810, a metal interconnect via V0 812, and a second layer metal M1 814.

The gates of the third PMOS transistor 774 and the second NMOS transistor 780 are electrically coupled to input A1 through gate connections 816 and 818, such as the gate connection 254 (shown in FIG. 6), including a poly gate contact, a via over gate VG, a first layer metal M0 and/or a metal interconnect via V0, which are not numbered for clarity, and a second layer metal M1 820. The gates of the fourth PMOS transistor 776 and the fourth NMOS transistor 784 are electrically coupled to input A2 through gate connections, such as the gate connection 254 (shown in FIG. 6), including poly gate contact 654, a via over gate VG 822, a first layer metal M0 824, a metal interconnect via V0 826, and a second layer metal M1 828 to another metal interconnect via V0, first layer metal M0, which are not numbered for clarity, and via over gate VG 830 and poly gate contact 652.

The output ZN of the second AOI22 function 634 includes a drain/source connection 832, such as the drain/source connection 250 (shown in FIG. 6), that includes the MD contact 684 electrically connected to a via over diffusion VD, a first layer metal M0 and/or a metal interconnect via V0, and a second layer metal M1, which are not numbered for clarity.

Figure 18:
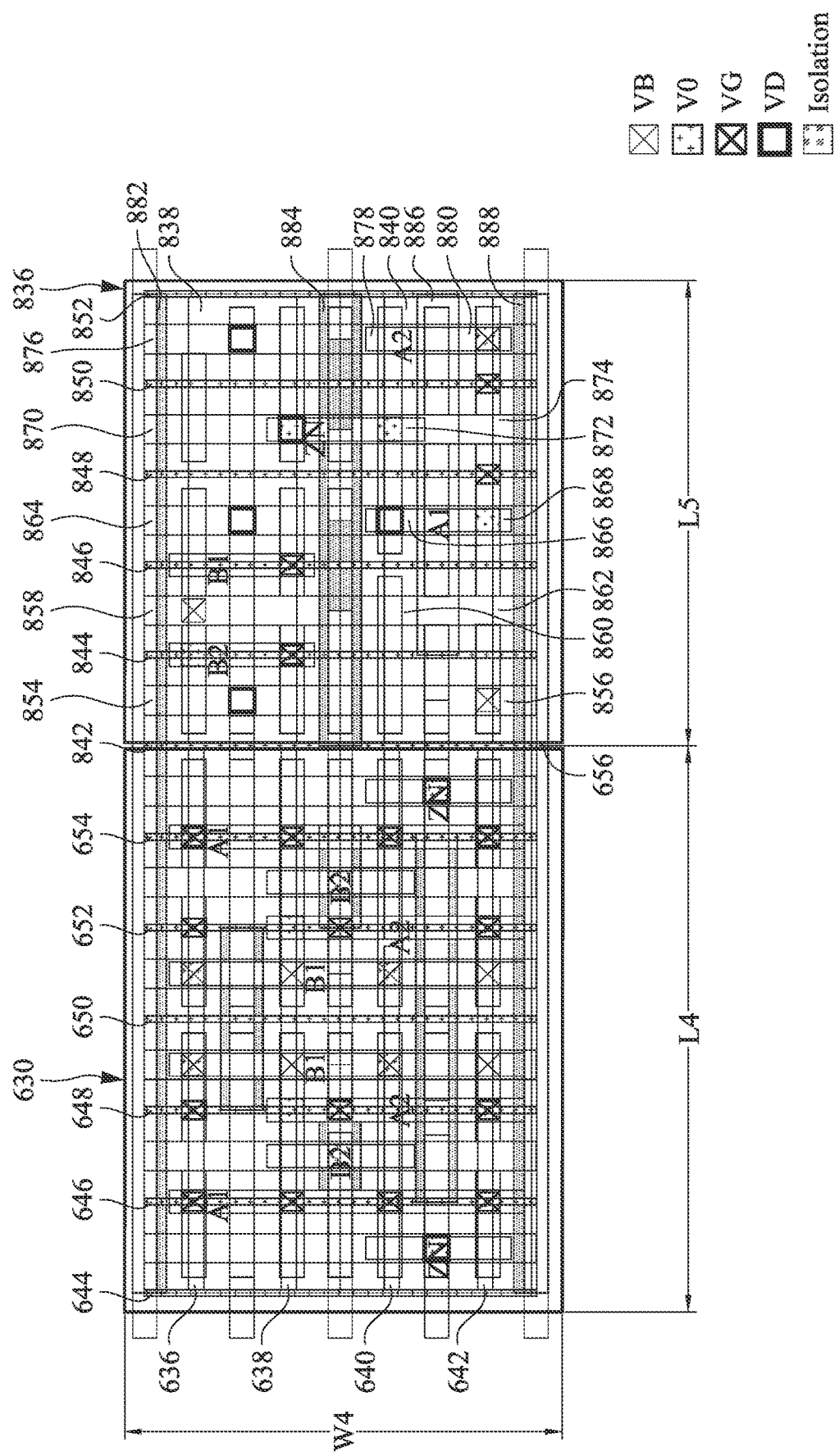
FIG. 18 is a diagram schematically illustrating the split PP/NN cell structure of FIG. 17 directly abutting a PPNN cell structure, in accordance with some embodiments.

FIG. 18 is a diagram schematically illustrating the split PP/NN cell structure 630 directly abutting a PPNN cell structure 836, in accordance with some embodiments. The split PP/NN cell structure 630 has a cell size that is 120% of the cell size of the PPNN cell structure 836. The split PP/NN cell structure 630 has a length L4 and a width W4 and the PPNN cell structure 836 has a length L5 and the width W4, where length L4 is greater than length L5. Also, the split PP/NN cell structure 630 includes two AOI22 functions 632 and 634, while the PPNN cell structure 836 includes only one AOI22 function, such that using the split PP/NN cell structure 630 increases the logic density of an IC.

The PPNN cell structure 836 includes two OD areas 838 and 840 extending in a first direction and six gate contacts 842, 844, 846, 848, 850, and 852 extending in a second direction that intersects the first direction. The two OD areas 838 and 840 include one p-type OD area 838 and one n-type OD area 840. In some embodiments, the first direction is perpendicular to the second direction. In some embodiments, the gate contacts 842, 844, 846, 848, 850, and 852 include polycrystalline silicon. In some embodiments, the gate contact 842 is shared with the gate contact 656 of the split PP/NN cell structure 630. In some embodiments, the gate contacts 842 and 656 are dummy gate contacts.

The PPNN cell structure 836 includes MD contacts 854, 856, 858, 860, 862, 864, 866, 868, 870, 872, 874, 876, 878, and 880 extending in the second direction. The PPNN cell structure 836 also includes CMD areas 882, 884, 886, and 888. The CMD area 884 is situated between the MD contacts 854 and 856 to separate the MD contacts 854 and 856 from each other, between the MD contacts 858 and 860 to separate the MD contacts 858 and 860 from each other, between the MD contacts 864 and 866 to separate the MD contacts 864 and 866 from each other, between the MD contacts 870 and 872 to separate the MD contacts 870 and 872 from each other, and between the MD contacts 876 and 878 to separate the MD contacts 876 and 878 from each other. The CMD area 886 is situated between the MD contacts 860 and 862 to separate the MD contacts 860 and 862 from each other, between the MD contacts 866 and 868 to separate the MD contacts 866 and 868 from each other, between the MD contacts 872 and 874 to separate the MD contacts 872 and 874 from each other, and between the MD contacts 878 and 880 to separate the MD contacts 878 and 880 from each other. The CMD areas 882 and 888 are situated at opposing ends of the PPNN cell structure 836 to cut off the MD contacts 854, 858, 864, 870, and 876 at one end and to cut off the MD contacts 856, 862, 868, 874, and 880 at the other end.

The MD contacts 854, 856, 858, 860, 862, 864, 866, 868, 870, 872, 874, 876, 878, and 880 are electrically connected to one of the OD areas 838 and 840. Each of the MD contacts 854, 858, 864, 870, and 876 is electrically connected to the OD area 838, and each of the MD contacts 856, 860, 862, 866, 868, 872, 874, 878, and 880 is electrically connected to the OD area 840.

Figure 19:
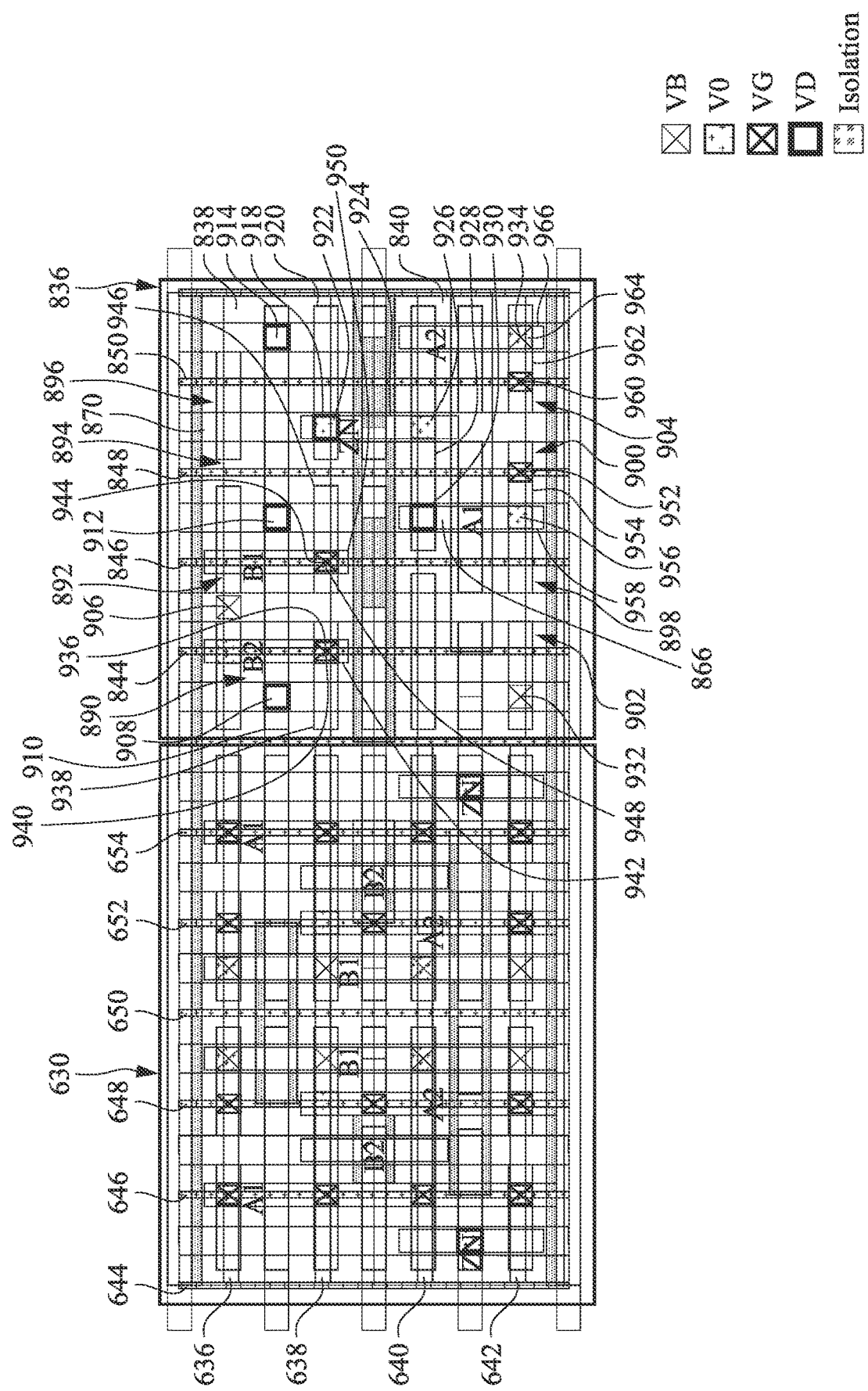
FIG. 19 is a diagram schematically illustrating the connections in the PPNN cell structure for the AOI22 function, in accordance with some embodiments.

FIG. 19 is a diagram schematically illustrating the connections in the PPNN cell structure 836 for the AOI22 function, in accordance with some embodiments. The PPNN cell structure 836 of FIG. 19 is the same as the PPNN cell structure 836 of FIG. 18, including the same OD areas 838 and 840, gate contacts 842, 844, 846, 848, 850, and 852, MD contacts 854, 856, 858, 860, 862, 864, 866, 868, 870, 872, 874, 876, 878, and 880, and CMD areas 882, 884, 886, and 888. However, the reference numerals in FIG. 18 may not be repeated in FIG. 19 to improve clarity.

The AOI22 function includes a first PMOS transistor 890, a second PMOS transistor 892, a third PMOS transistor 894, a fourth PMOS transistor 896, a first NMOS transistor 898, a second NMOS transistor 900, a third NMOS transistor 902, and a fourth NMOS transistor 904. In the AOI22 function, one side of the p-type OD area 838 of the first PMOS transistor 890 and one side of the p-type OD area 838 of the second PMOS transistor 892 are electrically connected to power Vdd through a power/reference connection, such as the power/reference connection 256 (shown in FIG. 6), that includes via VB 906. The other side of the p-type OD area 838 of the first PMOS transistor 890 is electrically connected to the other side of the p-type OD area 838 of the second PMOS transistor 892 by a via over drain VD 908 to a second layer metal M1 910, and to via over drain VD 912. The other side of the p-type OD area 838 of the second PMOS transistor 892 is electrically connected or shared with one side of the p-type OD area 838 of the third PMOS transistor 894 and electrically connected to one side of the p-type OD area 838 of the fourth PMOS transistor 896 by the second layer metal M1 910 and via over drain 914. The other side of the p-type OD area 838 of the third PMOS transistor 894 and the other side of the p-type OD area 838 of the fourth PMOS transistor 896 are electrically connected or shared at the output Zn.

The output ZN includes a drain/source connection, such as the drain/source connection 250 (shown in FIG. 6), that includes the MD contact 870 electrically connected to a via over diffusion VD 918, a first layer metal M0 920, a metal interconnect via V0 922, and a second layer metal M1 924 that is electrically connected to one side of the n-type OD area 840 of the first NMOS transistor 898 and to one side of the n-type OD area 840 of the second NMOS transistor 900 through a metal interconnect via V0 926, a first layer metal M0 928, a via over diffusion VD 930, and MD contact 866.

The other side of the n-type OD area 840 of the first NMOS transistor 898 is electrically connected to one side of the n-type OD area 840 of the third NMOS transistor 902 and the other side of the n-type OD area 840 of the third NMOS transistor 902 is electrically connected to a reference Vss through a power/reference connection, such as the power reference connection 256, including VB 932. The other side of the n-type OD area 840 of the second NMOS transistor 900 is electrically connected to one side of the n-type OD area 840 of the fourth NMOS transistor 904 and the other side of the n-type OD area 840 of the fourth NMOS transistor 904 is electrically connected to a reference Vss through a power/reference connection, such as the power reference connection 256, including VB 934.

The gates of the first PMOS transistor 890 and the third NMOS transistor 902 are electrically coupled to input B2 through gate connections, such as the gate connection 254 (shown in FIG. 6), including a poly gate contact 844, a via over gate VG 936, a first layer metal M0 938, a metal interconnect via V0 940, and a second layer metal M1 942. The gates of the second PMOS transistor 892 and the first NMOS transistor 898 are electrically coupled to input B1 through gate connections, such as the gate connection 254 (shown in FIG. 6), including a poly gate contact 846, a via over gate VG 944, a first layer metal M0 946, a metal interconnect via V0 948, and a second layer metal M1 950.

The gates of the third PMOS transistor 894 and the second NMOS transistor 900 are electrically coupled to input A1 through gate connections, such as the gate connection 254 (shown in FIG. 6), including a poly gate contact 848, a via over gate VG 952, a first layer metal M0 954, a metal interconnect via V0 956, and a second layer metal M1 958. The gates of the fourth PMOS transistor 896 and the fourth NMOS transistor 904 are electrically coupled to input A2 through gate connections, such as the gate connection 254 (shown in FIG. 6), including poly gate contact 850, a via over gate VG 960, a first layer metal M0 962, a metal interconnect via V0 964, and a second layer metal M1 966.

The split PP/NN cell structure 630 directly abuts the PPNN cell structure 836, where the split PP/NN cell structure 630 has a cell size that is 120% of the cell size of the PPNN cell structure 836, and the split PP/NN cell structure 630 includes two AOI22 functions 632 and 634, while the PPNN cell structure 836 includes only one AOI22 function. Thus, using the split PP/NN cell structure 630 increases the logic density of an IC.

Figure 20:
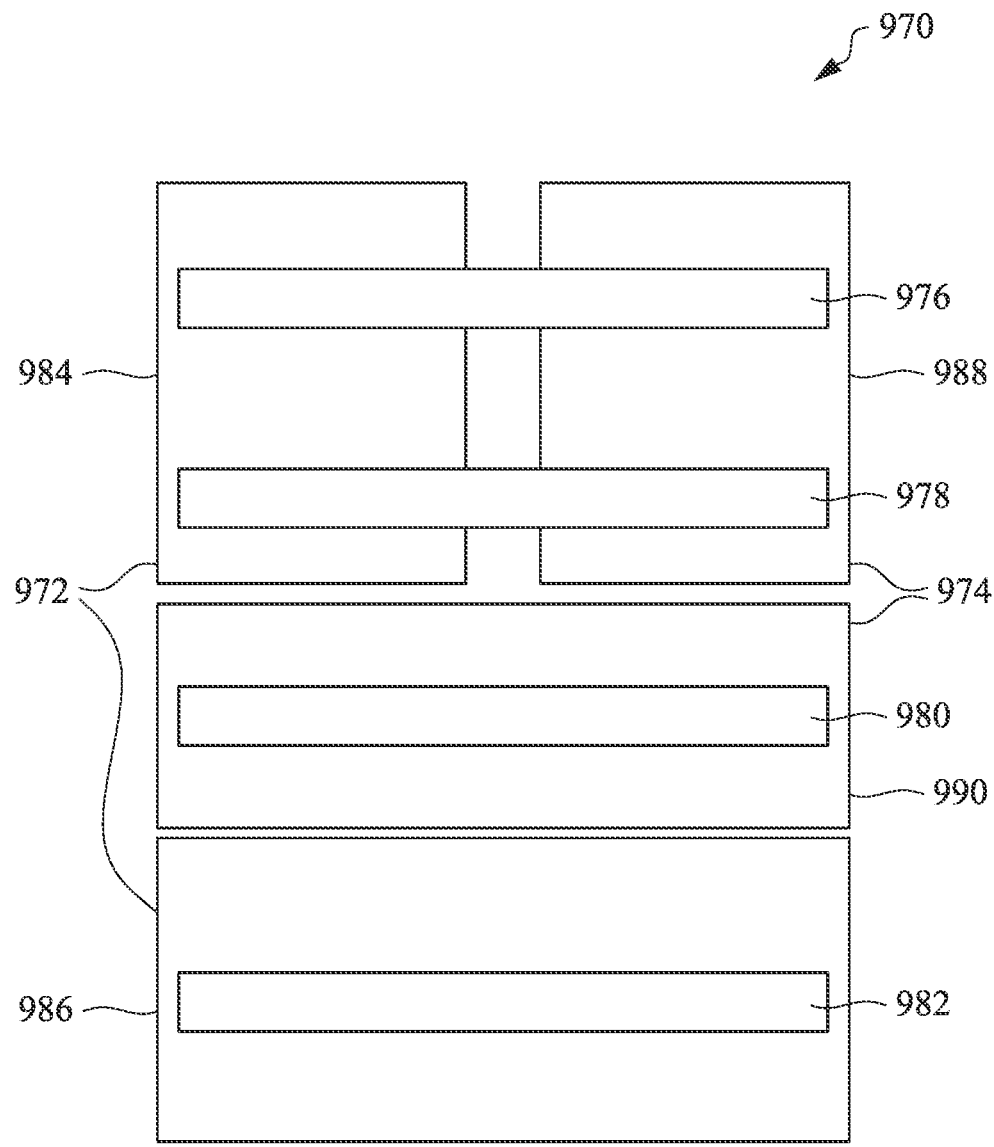
FIG. 20 is a diagram schematically illustrating another split PP/NN cell structure that includes a first logic gate/function and a second logic gate/function that is different than the first logic gate/function, in accordance with some embodiments.

FIG. 20 is a diagram schematically illustrating another split PP/NN cell structure 970 that includes a first logic gate/function 972 and a second logic gate/function 974 that is different than the first logic gate/function 972, in accordance with some embodiments. In some embodiments, one of the logic gate/functions 972 and 974 is a 2-input Nand gate and the other is a 2-input Nor gate.

The split PP/NN cell structure 970 includes four OD areas 976, 978, 980, and 982 extending in a first direction and gate contacts (not shown) extending in a second direction that intersects the first direction. The four OD areas 976, 978, 980, and 982 include two p-type OD areas 976 and 978 and two n-type OD areas 980 and 982. The split PP/NN cell structure 970 can be arranged like the split PP/NN cell structure 410 of FIG. 11, such that the first logic gate/function 972 includes a first p-type section 984 and a first n-type section 986, and the second logic gate/function 974 includes a second p-type section 988 and a second n-type section 990. Also, the split PP/NN structure 970 includes MD contacts, CMD contacts, and connections to complete the logic gate/functions 972 and 974. In some embodiments, the first direction is perpendicular to the second direction. In some embodiments, the gate contacts include polycrystalline silicon.

In some embodiments, the split PP/NN cell structure 970 can be used in a planar FET device. In some embodiments, the split PP/NN cell structure 970 can be used in a finFET device. In some embodiments, the split PP/NN cell structure 970 can be used in a nano sheet device.

The split PP/NN cell structure 970 can directly abut PPNN cell structures, where the split PP/NN cell structure 970 has a cell size that is the same as the cell size of the PPNN cell structure and the split PP/NN cell structure 970 includes two different logic gate/functions, while the PPNN cell structure includes only one logic gate/function. Thus, using the split PP/NN cell structure 970 increases flexibility and the logic density of an IC.

Figure 21:
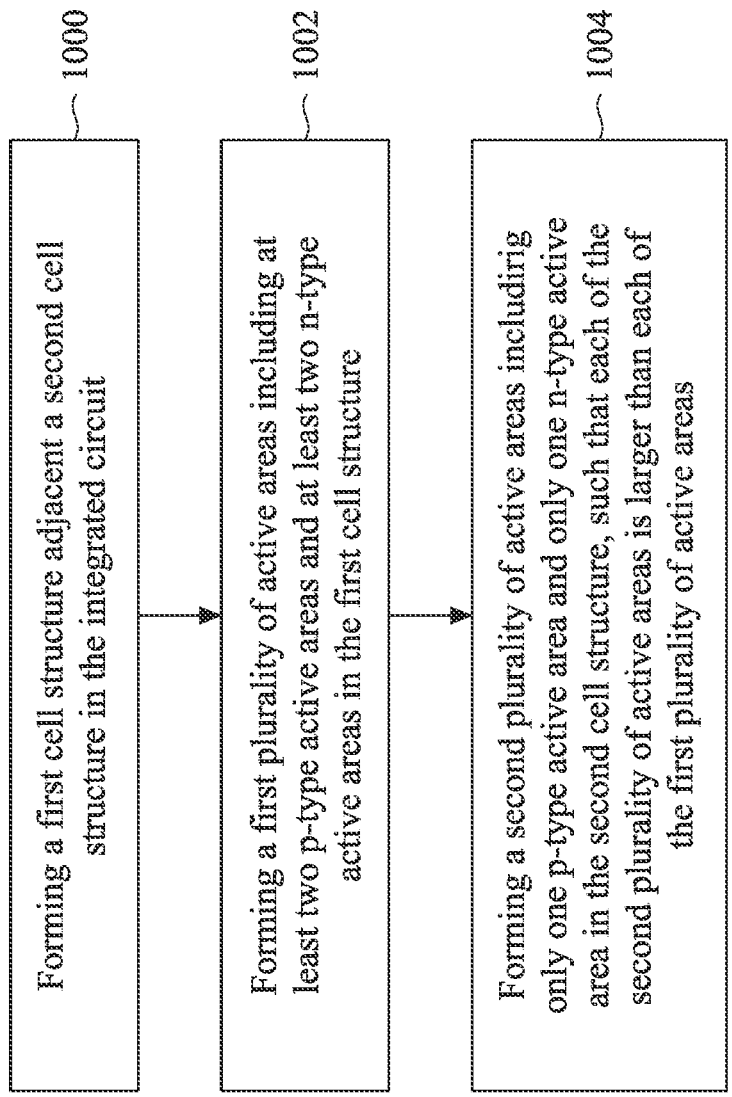
FIG. 21 is a diagram schematically illustrating a method of manufacturing an integrated circuit, in accordance with some embodiments.

FIG. 21 is a diagram schematically illustrating a method of manufacturing an integrated circuit, in accordance with some embodiments. At step 1000, the method includes forming a first cell structure adjacent a second cell structure in the integrated circuit. In some embodiments, the method includes forming the first cell structure to directly abut the second cell structure in the integrated circuit. In some embodiments, the method includes forming the first cell structure to have a first cell structure size and the second cell structure to have a second cell structure size that is the same as the first cell structure size. In some embodiments, the method includes forming the first cell structure to have a first cell structure size that is greater than the second cell structure size. In some embodiments, the method includes forming the first cell structure to have a first cell structure size that is 120% of the second cell structure size.

At step 1002, the method includes forming a first plurality of active areas including at least two p-type active areas and at least two n-type active areas in the first cell structure and, at step 1004, the method includes forming a second plurality of active areas including only one p-type active area and only one n-type active area in the second cell structure. The method further includes forming each of the second plurality of active areas to be larger than each of the first plurality of active areas. Also, in some embodiments, forming the first plurality of active areas and forming the second plurality of active areas includes forming the first plurality of active areas to extend in a first direction and forming the second plurality of active areas to extend in the first direction, and including forming a first plurality of gates in the first cell structure that extend in a second direction that is different than the first direction, and forming a second plurality of gates in the second cell structure that extend in the second direction.

In some embodiments, the method includes forming an insulating layer between a metal over diffusion contact and at least one active area of the first plurality of active areas, and forming the metal over diffusion contact directly on at least one other of the first plurality of active areas.

Thus, disclosed embodiments include a split PP/NN cell structure that is directed to increasing the logic density of an IC. In some embodiments, the split PP/NN cell structure has a cell size that is the same as the cell size of a PPNN cell structure. In some embodiments, the split PP/NN cell structure has a cell area that is 120% of the cell area of the PPNN cell structure. In some embodiments, the split PP/NN cell structure includes more logic gates/functions in one cell of the split PP/NN cell structure than in one cell of the PPNN cell structure, which increases the logic density of the IC. Also, for the split PP/NN cell structure, the gates are broken off between a P-N boundary, just as in the PPNN cell structure, such that the split PP/NN cell structure can directly abut a PPNN cell structure without gates shorting together and without a buffer area situated between the split PP/NN cell structure and the PPNN cell structure, which increases the logic density of the IC.

Embodiments of the disclosure further include split PP/NN cell structures that include one or more fly MD contacts that are electrically insulated, by an insulation layer, from the OD areas situated below the MDs. This enables providing more logic gates/functions in one cell. Also, the subject matter of this disclosure can be used in different technologies, such as planar FET technologies, FinFET technologies, and nano sheet technologies.

In accordance with some embodiments, an integrated circuit includes a first cell and a second cell. The first cell includes a first plurality of active areas that extend in a first direction and a first plurality of gates that extend in a second direction that crosses the first direction, the first cell having first cell edges defined by breaks in the first plurality of gates. The second cell includes a second plurality of active areas that extend in the first direction and a second plurality of gates that extend in the second direction, the second cell having second cell edges defined by breaks in the second plurality of gates. Each of the second plurality of active areas is larger than each of the first plurality of active areas and the first cell is adjacent the second cell such that the first cell edges align with the second cell edges.

In accordance with further embodiments, a semiconductor device includes a first cell that includes a first plurality of active areas, a metal over diffusion contact, and an insulating layer. The first plurality of active areas includes two or more p-type active areas and two or more n-type active areas. The metal over diffusion contact extends over the two or more p-type active areas and the two or more n-type active areas and contacts at least two of the first plurality of active regions, and the insulating layer is between the metal over diffusion contact and at least one other of the first plurality of active regions.

In accordance with still further disclosed aspects, a method of manufacturing an integrated circuit includes forming a first cell structure adjacent a second cell structure in the integrated circuit; forming a first plurality of active areas including at least two p-type active areas and at least two n-type active areas in the first cell structure; and forming a second plurality of active areas including only one p-type active area and only one n-type active area in the second cell structure, wherein forming the first plurality of active areas and forming the second plurality of active areas includes forming each of the second plurality of active areas to be larger than each of the first plurality of active areas.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a first cell comprising a first plurality of active areas that extend in a first direction and a first plurality of gates that extend in a second direction that crosses the first direction, the first cell having first cell edges defined by breaks in the first plurality of gates; and
   a second cell comprising a second plurality of active areas that extend in the first direction and a second plurality of gates that extend in the second direction, the second cell having second cell edges defined by breaks in the second plurality of gates,
   wherein each of the second plurality of active areas is larger than each of the first plurality of active areas and the first cell is adjacent the second cell such that the first cell edges align with the second cell edges.

2. The integrated circuit of claim 1, wherein the second cell directly abuts the first cell.

3. The integrated circuit of claim 1, wherein the first cell includes two p-type active areas and two n-type active areas, and the second cell includes one p-type active area and one n-type active area.

4. The integrated circuit of claim 1, wherein the first cell has a length and a width and the second cell has the same length and the same width.

5. The integrated circuit of claim 1, wherein the first direction is perpendicular to the second direction.

6. The integrated circuit of claim 1, wherein the first cell includes a metal over diffusion contact that is insulated from one or more of the first plurality of active areas.

7. The integrated circuit of claim 1, wherein the first cell includes a metal over diffusion contact that connects to at least one of the first plurality of active areas and is insulated from at least one other of the first plurality of active areas.

8. The integrated circuit of claim 1, wherein the first cell includes two logic gates, and the second cell includes one logic gate.

9. The integrated circuit of claim 1, wherein the first cell is a planar field-effect transistor cell, a finFET cell, or a nano sheet cell.

10. A semiconductor device comprising:
    a first cell comprising:
      a first plurality of active areas that includes two or more p-type active areas and two or more n-type active areas;
      a metal over diffusion contact that extends over the two or more p-type active areas and the two or more n-type active areas and contacts at least two of the first plurality of active areas; and
      an insulating layer between the metal over diffusion contact and at least one other of the first plurality of active areas.

11. The semiconductor device of claim 10, comprising a second cell that includes a second plurality of active areas, wherein each of the second plurality of active areas is larger than each of the first plurality of active areas.

12. The semiconductor device of claim 11, wherein the first cell has a first cell area and the second cell has a second cell area that is the same as the first cell area.

13. The semiconductor device of claim 11, wherein the first cell has a first cell area and the second cell has a second cell area, and the first cell area is 20% larger than the second cell area.

14. The semiconductor device of claim 11, wherein the second cell directly abuts the first cell.

15. The semiconductor device of claim 11, wherein the first cell includes two logic functions, and the second cell includes one logic function.

16. A method of manufacturing an integrated circuit comprising:
    forming a first cell structure adjacent a second cell structure in the integrated circuit;
    forming a first plurality of active areas including at least two p-type active areas and at least two n-type active areas in the first cell structure; and
    forming a second plurality of active areas including only one p-type active area and only one n-type active area in the second cell structure,
    wherein forming the first plurality of active areas and forming the second plurality of active areas includes forming each of the second plurality of active areas to be larger than each of the first plurality of active areas.

17. The method of claim 16, comprising forming the first cell structure to have a first cell structure size and the second cell structure to have a second cell structure size that is the same as the first cell structure size.

18. The method of claim 16, comprising:
    forming an insulating layer between a metal over diffusion contact and at least one active area of the first plurality of active areas; and forming the metal over diffusion contact directly on at least one other active area of the first plurality of active areas.

19. The method of claim 16, wherein forming the first cell structure adjacent the second cell structure in the integrated circuit includes forming the first cell structure to directly abut the second cell structure in the integrated circuit.

20. The method of claim 16, wherein forming the first plurality of active areas and forming the second plurality of active areas includes forming the first plurality of active areas to extend in a first direction and forming the second plurality of active areas to extend in the first direction, and comprising forming a first plurality of gates in the first cell structure that extend in a second direction that is different than the first direction, and forming a second plurality of gates in the second cell structure that extend in the second direction.

\* \* \* \* \*